(12) United States Patent
Suzuki et al.

(10) Patent No.: US 7,261,207 B2
(45) Date of Patent: Aug. 28, 2007

(54) METHOD FOR CARRYING A SEMICONDUCTOR DEVICE

(75) Inventors: Hiromichi Suzuki, Tokyo (JP); Wahei Kitamura, Kodaira (JP); Tokuji Toida, Hamura (JP); Toshimasa Shirai, Tatomi (JP)

(73) Assignees: Renesas Technology Corp., Tokyo (JP); Hitachi Transport System Ltd., Tokyo (JP)

( * ) Notice: Subject to any disclaimer, the term of this patent is extended or adjusted under 35 U.S.C. 154(b) by 419 days.

(21) Appl. No.: 10/770,581

(22) Filed: Feb. 4, 2004

(65) Prior Publication Data

US 2004/0181938 A1 Sep. 23, 2004

(30) Foreign Application Priority Data

Mar. 19, 2003 (JP) ............................. 2003-076402

(51) Int. Cl.
*B65D 85/48* (2006.01)
(52) U.S. Cl. ........................................ 206/711; 414/940
(58) Field of Classification Search ................ 206/454, 206/701, 710, 711, 712; 414/217, 935, 940
See application file for complete search history.

(56) References Cited

U.S. PATENT DOCUMENTS 5,024,329 A * 6/1991 Grohrock ................... 206/710

6,779,667 B2 * 8/2004 Nigg et al. ................. 206/711

FOREIGN PATENT DOCUMENTS

| JP | 7-76390 | 7/1993 |
| JP | 10-194376 | 1/1997 |
| JP | 2000-95291 | 9/1998 |

* cited by examiner

*Primary Examiner*—Richard Chang
(74) *Attorney, Agent, or Firm*—Reed Smith LLP; Stanley P. Fisher, Esq.; Juan Carlos A. Marquez, Esq.

(57) ABSTRACT

A method for carrying a semiconductor device includes: (a) providing semiconductor devices each having a main surface, a back surface, and a plurality of external terminals; (b) providing a tray having a front surface, a rear surface, an electronic tag imbedded in the tray, first concaved portions formed on the front surface, second concaved portions formed on the rear surface, the electronic tag constituted by a non-contact recognition type chip having a memory circuit in which recognizable information is stored, a depth of the first concaved portion is deeper than a depth of the second concaved portion; (c) housing the semiconductor devices into the first concaved portions respectively in such a manner that the back surface of the semiconductor device being oppose to a bottom of the first concaved portion; and (d) carrying the tray with the semiconductor devices.

8 Claims, 20 Drawing Sheets

1: TRAY (RECEPTACLE)
1a: POCKET (CONCAVE PORTION)
31: ELECTRONIC TAG

3: SEMICONDUCTOR CHIP
(SEMICONDUCTOR DEVICE)

14: GLASS SUBSTRATE (SUBSTRATE)

26a: POCKET (CONCAVE PORTION)

27: BAR CODE

METHOD FOR CARRYING A SEMICONDUCTOR DEVICE

BACKGROUND OF THE INVENTION

The present invention relates to semiconductor device carrying, mounting and packing techniques, as well as a technique for re-utilizing receptacles. Particularly, the present invention is concerned with a technique which is effectively applicable to the improvement of dustproofness.

In a carrier used to accommodate semiconductor chips as objects to be accommodated and carry them, plural (five for example) trays each accommodating semiconductor chips are stacked and a cover is applied onto the top tray, then a group of trays thus stacked are united using fixing means such as rubber ring or clip, and the thus-united tray group is carried as a carrier (see, for example, Patent Literature 1).

A carrier tape used for accommodating and carrying electronic components has feed holes formed on one side thereof continuously at equal intervals to carry the carrier tape when mounted on a chip mounting machine. Further, receptacle portions for accommodating electronic components are formed centrally of the carrier tape by drawing, which receptacle portions each have side walls and a bottom (see, for example, Patent Literature 2).

A bar code indicative of an identification number of the carrier is affixed to the carrier, and the type of machine, lot number and wafer number of semiconductor chips, which information pieces are stored in a computer, are managed on the basis of the identification number of the bar code (see, for example, Patent Literature 3).

[Patent Literature 1]
Japanese Published Unexamined Patent Application No. Hei 10(1998)-194376 (page 5, FIG. 6)

[Patent Literature 2]
Japanese Published Unexamined Patent Application No. Hei 7(1995)-76390 (page 3, FIG. 1)

[Patent Literature 3]
Japanese Published Unexamined Patent Application No. 2000-95291 (page 4, FIG. 1)

SUMMARY OF THE INVENTION

As the technique for accommodating and carrying semiconductor devices such as semiconductor chips or semiconductor packages there is known a technique using trays or a carrier tape (also referred to as tape-reel hereinafter).

The present inventor has made a study about a technique for carrying semiconductor chips with use of trays. According to the technique which the present inventor has studied, in case of carrying semiconductor chips with use of trays, a label describing product name, lot number and quantity is affixed onto a lid so that accommodated products can be seen for each tray within a dustproof packing. However, since the label is made of paper, there arises the problem that such dust-generating substances as paper powder, adhesive and ink are produced within the dustproof bag.

Recently, bare chip products of a so-called narrow pitch type having a narrow pitch between bump electrodes have been increasing, and at the time of accommodating such semiconductor chips in a tray, the generation of dust caused by paper label poses a serious problem.

In carrying semiconductor devices with use of such receptacles as trays or a tape-reel, the receptacles differ in shape according to manufacturers, giving rise to the problem that the sorting work for re-utilizing the receptacles is troublesome.

Therefore, a technique having both a measure against the generation of dust and a measure for re-utilizing receptacles is becoming more and more necessary.

It is an object of the present invention to provide semiconductor device carrying, mounting and packing methods and a method for re-utilizing receptacles used therein, which can realize clean accommodation and carrying of semiconductor devices.

It is another object of the present invention to provide semiconductor device carrying, mounting and packing methods and a method for re-utilizing receptacles used therein, which are easy to carry out and permit correct sorting of receptacles.

It is a further object of the present invention to provide semiconductor device carrying, mounting and packing methods and a method for re-utilizing receptacles used therein, which can realize clean mounting of semiconductor devices.

The above and other objects and novel features of the present invention will become apparent from the following description and the accompanying drawings.

Typical modes of the present invention as disclosed herein will be outlined below.

The present invention comprises the steps of: providing a tray or tape-reel having an electronic tag, the electronic tag being constituted by a non-contact recognition type chip having a memory circuit with recognizable information stored therein; accommodating semiconductor devices in the tray or tape-reel; and carrying the tray or tape-reel with the semiconductor devices accommodated therein.

The present invention comprises the steps of: providing a tray or tape-reel having an electronic tag and with semiconductor devices accommodated therein, the electronic tab being constituted by a non-contact recognition type chip having a memory circuit with recognizable information stored therein; taking out the semiconductor devices from the tray or tape-reel; and mounting each of the semiconductor devices onto a substrate.

Moreover, the present invention comprises the steps of: providing a tray or tape-reel having an electronic tag, the electronic tag being constituted by a non-contact recognition type chip having a memory circuit with recognizable information stored therein; accommodating semiconductor devices corresponding to the information stored in the non-contact recognition type chip of the electronic tag into the tray or tape-reel in a clean environment wherein a dust particle size is not larger than a predetermined value; and storing the tray or tape-reel with the semiconductor devices accommodated thereon into a moistureproof bag.

Further, the present invention comprises the steps of: accommodating in an IC manufacturer the semiconductor devices onto the receptacle having recognizable information and thereafter shipping the receptacle from the IC manufacturer; delivering the shipped receptacle to a mounting manufacturer, thereafter, in the mounting manufacturer, taking out the semiconductor devices from the receptacle and mounting each of them onto a substrate; recovering and sorting in a recovery/re-use trader the receptacle which has been used in the mounting manufacturer, and after the sorting, returning the receptacle to the IC manufacturer; and re-utilizing the receptacle in the IC manufacturer.

DETAILED DESCRIPTION OF THE PREFERRED EMBODIMENTS

Figure 1:
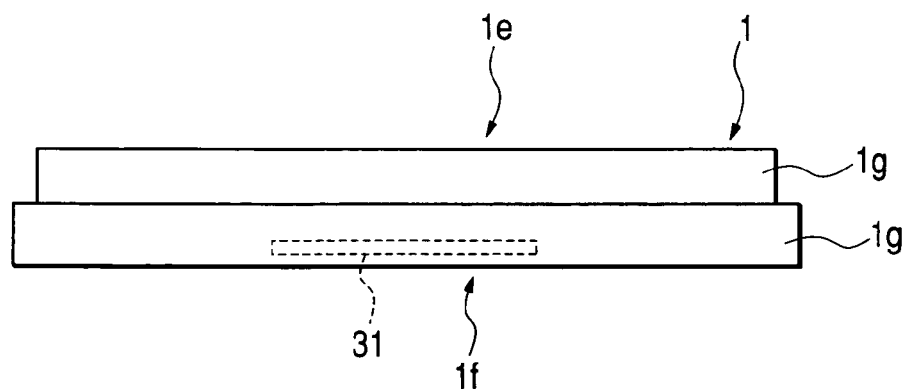
FIG. 1 is a side view showing a structural example of a tray (receptacle) used in a semiconductor device carrying method according to a first embodiment of the present invention.

In the following embodiments, explanations of the same or similar portions will not be repeated in principle except when specially required.

The following embodiments will be described dividedly into plural sections or embodiments where required for the sake of convenience, but unless otherwise mentioned, they are not unrelated to each other, but one is in a relation of modification or detailed or supplementary explanation of part or the whole of the other.

Further, in the following embodiments, when reference is made to, for example, the number of elements (including the number of pieces, numerical value, quantity, and range), no limitation is made to the specified number, but numbers above and below the specified number will do unless otherwise specified and except the case where limitation is made to the specified number basically clearly.

Embodiments of the present invention will be described in detail hereinunder with reference to the accompanying drawings. In all of the drawings for illustrating the embodiments, components having the same functions are identified by the same reference numerals, and repeated explanations thereof will be omitted.

First Embodiment

Figure 2:
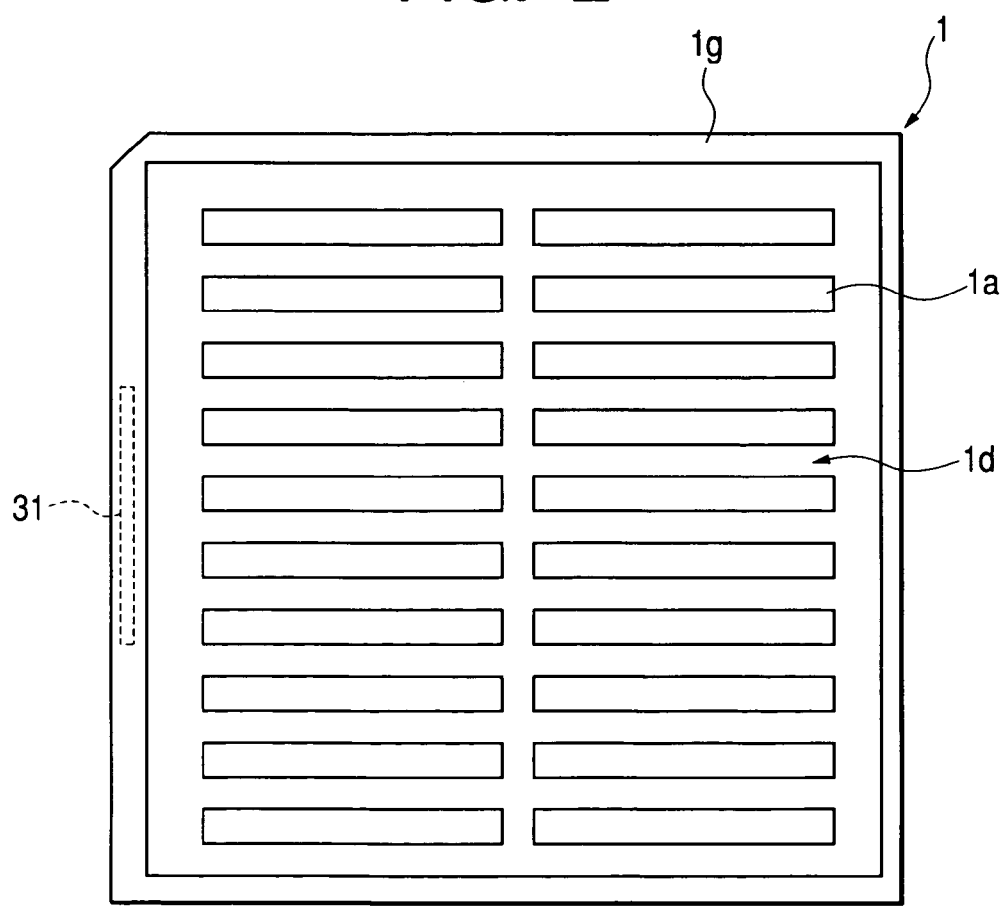
FIG. 2 is a plan view showing the structure of the tray illustrated in FIG. 1.
Figure 3:
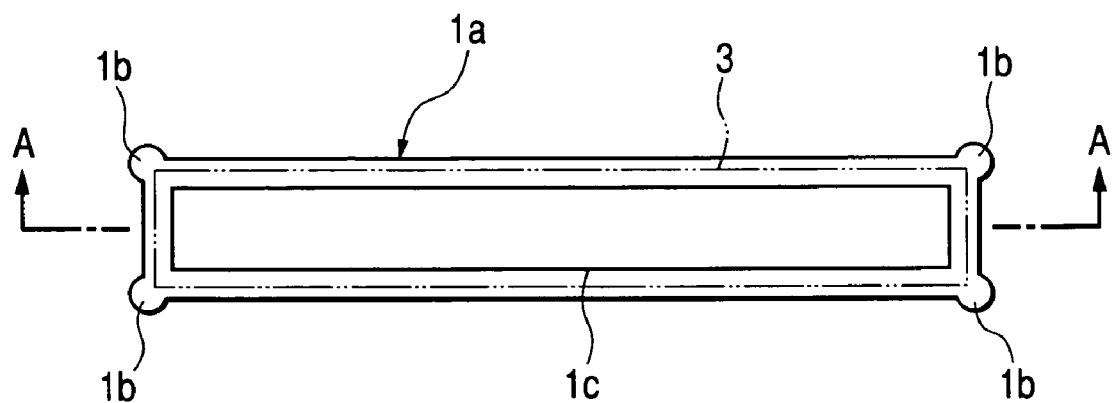
FIG. 3 is an enlarged plan view showing the structure of a pocket portion of the tray illustrated in FIG. 2.
Figure 4:
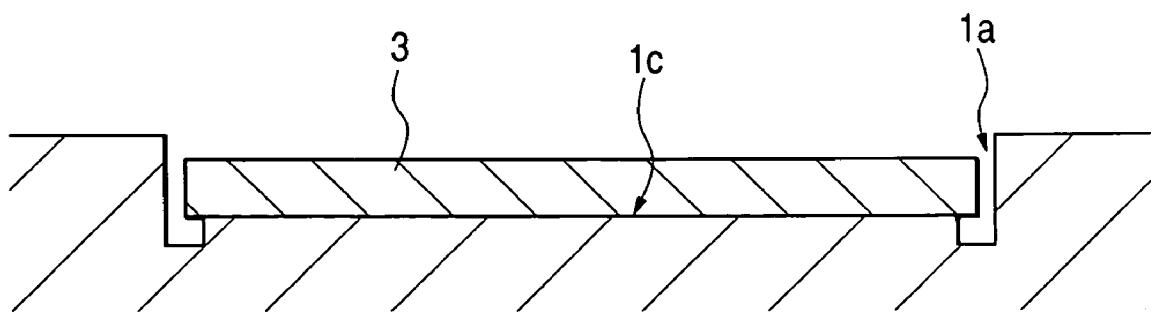
FIG. 4 is a partial sectional view taken along line A-A in FIG. 3 with a chip accommodated in the pocket portion.
Figure 5:
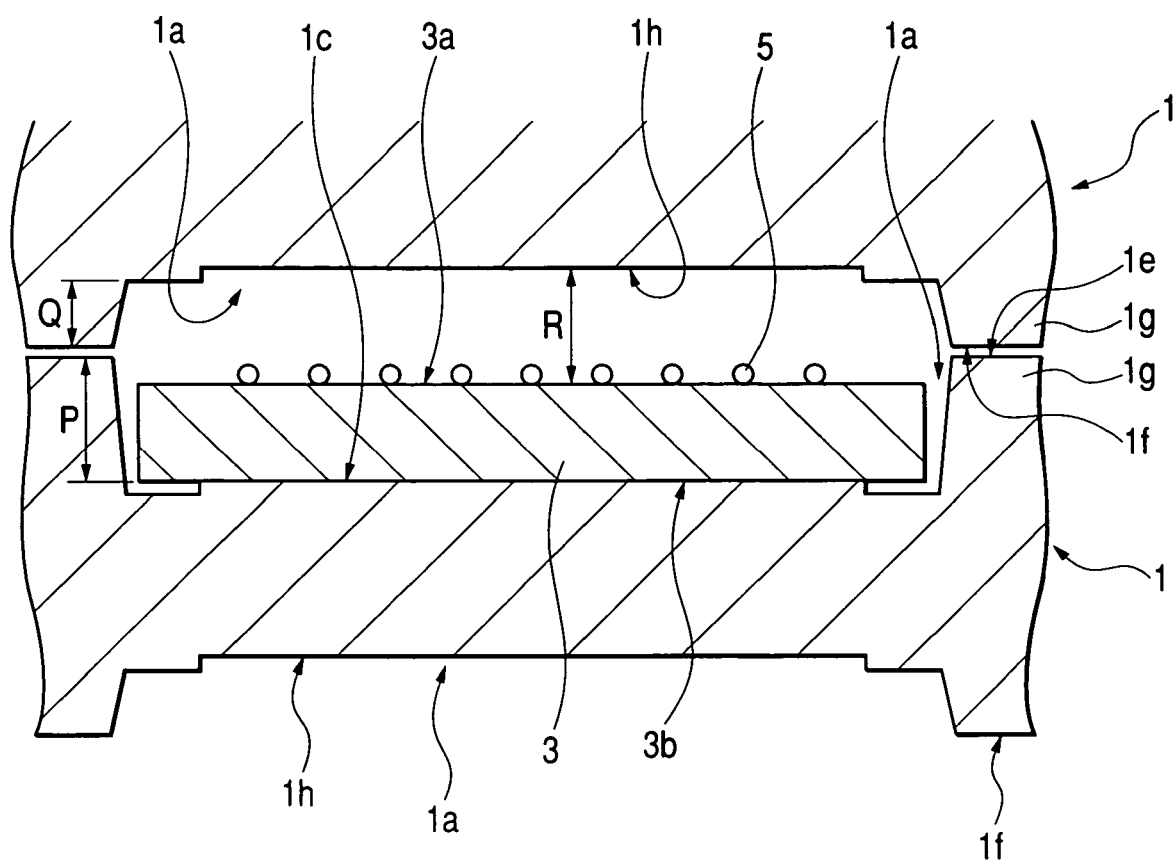
FIG. 5 is an enlarged sectional view of pocket portions, showing a structural example during conveyance of chips using the tray illustrated in FIG. 1.
Figure 6:
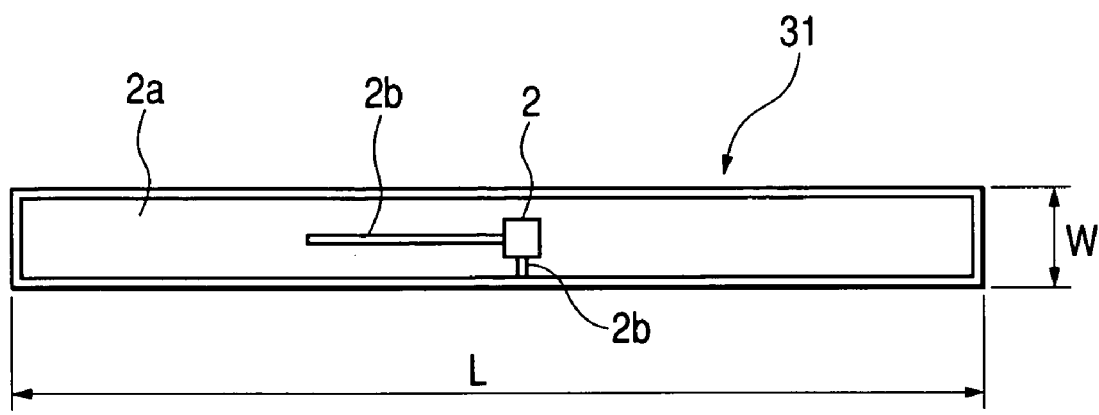
FIG. 6 is a plan view showing a structural example of an electronic tag, the electronic tag being constituted by a mu-chip (non-contact recognition type chip) with external antenna which is buried in the tray illustrated in FIG. 1.
Figure 7:
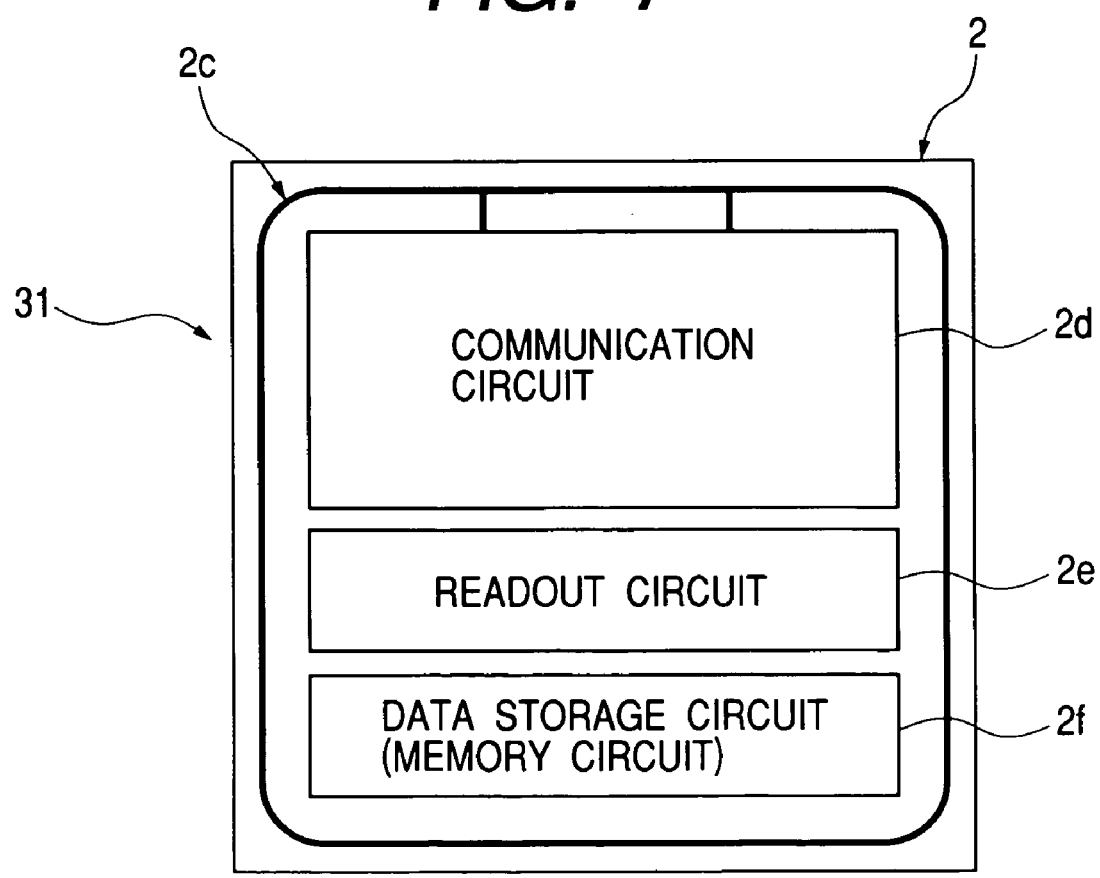
FIG. 7 is a circuit configuration diagram showing an example of a circuit configuration of an electronic tag, the electronic tag being constituted by an antenna built-in type mu-chip (non-contact recognition type chip) which is buried in the tray illustrated in FIG. 1.
Figure 8:
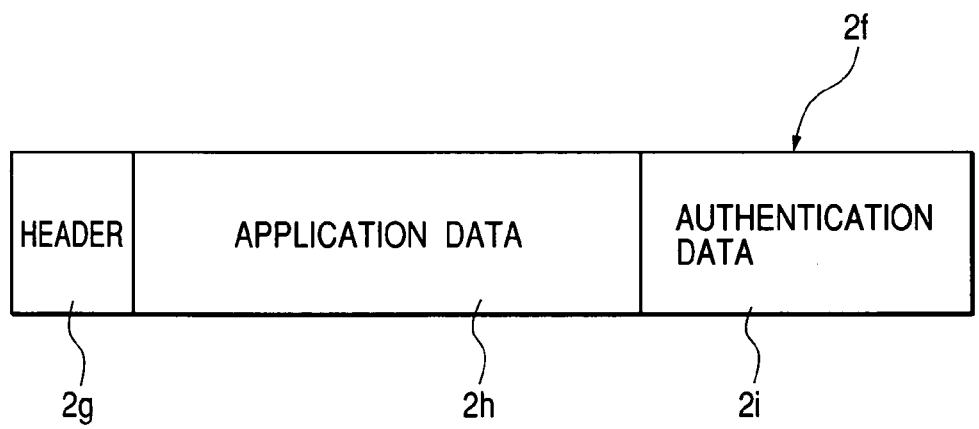
FIG. 8 is a data construction diagram showing a structural example of data in a data storage circuit which is formed in the mu-chip of the electronic tag illustrated in FIG. 7.
Figure 9:
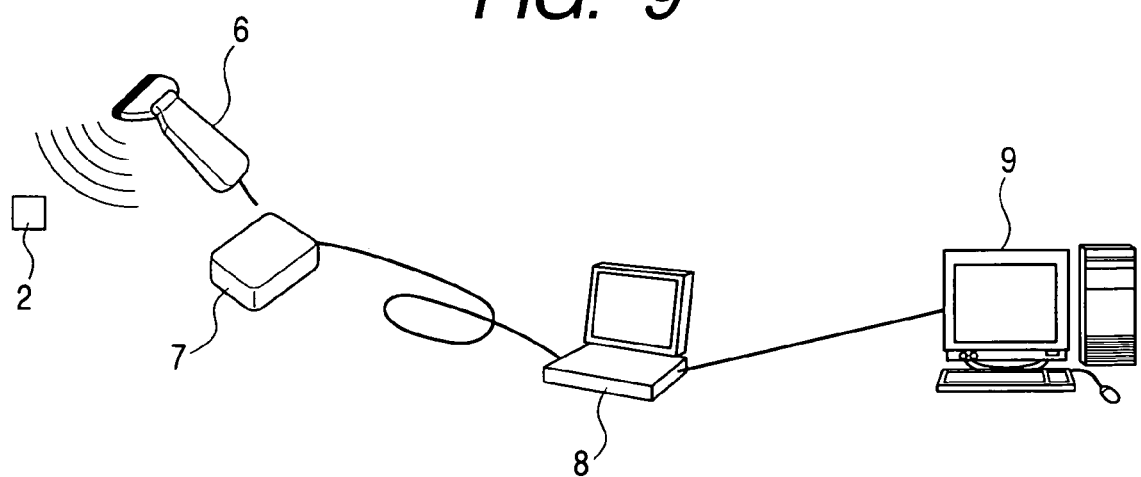
FIG. 9 is a construction diagram showing an example of in what state the electronic tag illustrated in FIG. 6 is utilized.
Figure 10:
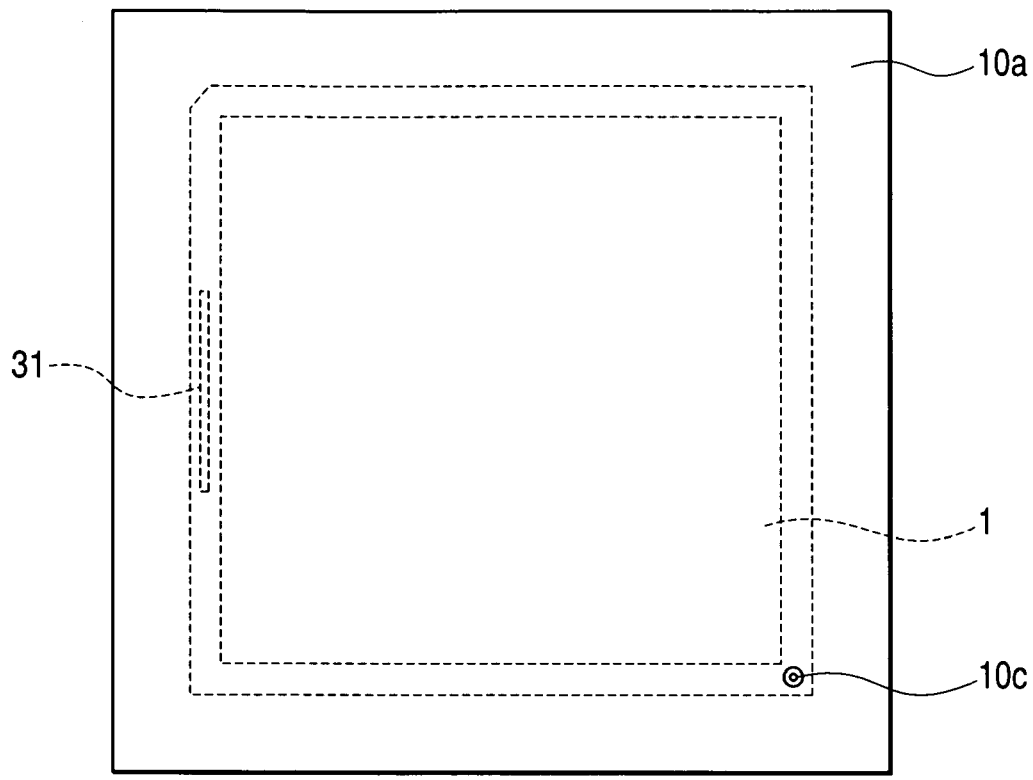
FIG. 10 is a plan view showing a structural example of a molding die which is used at the time of burying the electronic tag illustrated in FIG. 6 into the tray.
Figure 11:
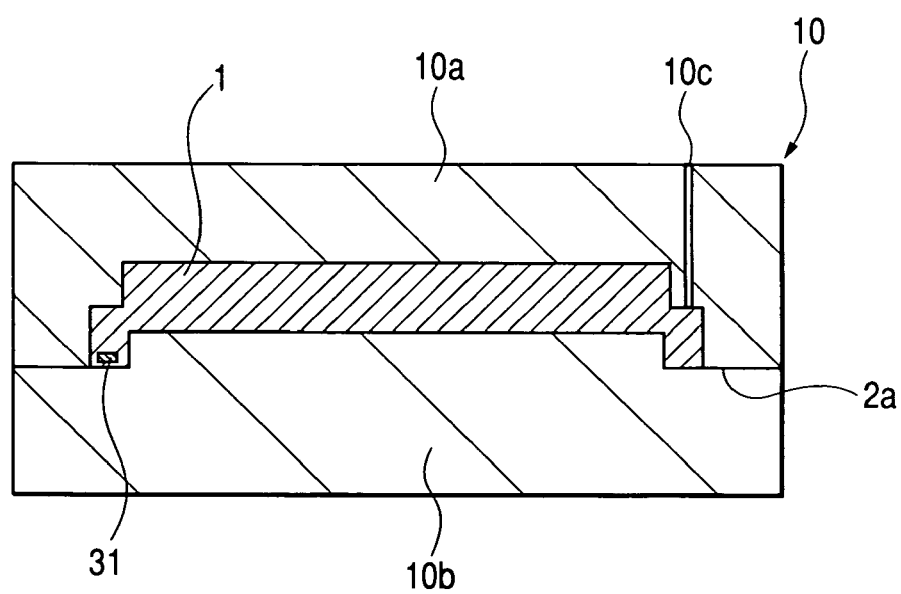
FIG. 11 is a sectional view showing the structure of the molding die illustrated in FIG. 10.
Figure 12:
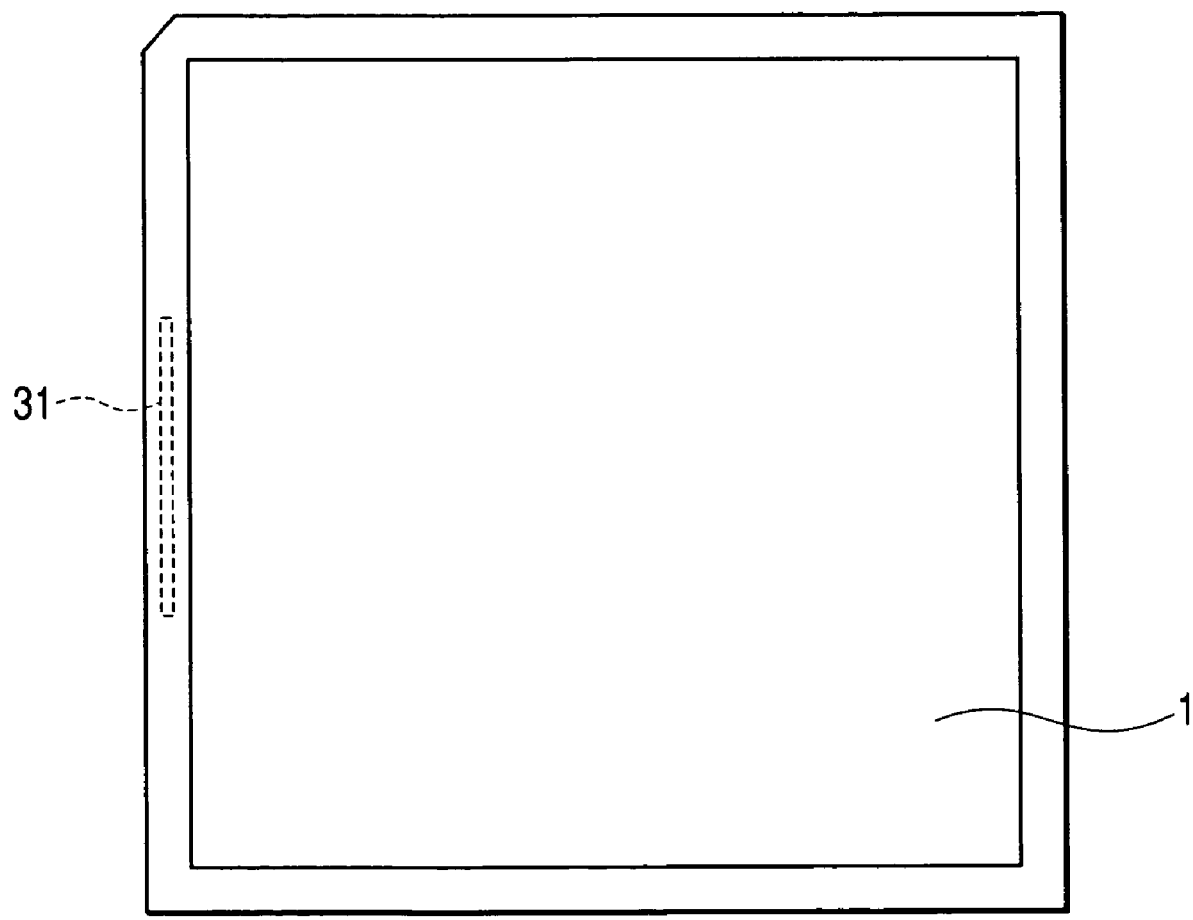
FIG. 12 is a plan view showing a structural example of a tray having an electronic tag, the electronic tag being constituted by a mu-chip with external antenna fabricated by using the molding die illustrated in FIG. 10.
Figure 13:
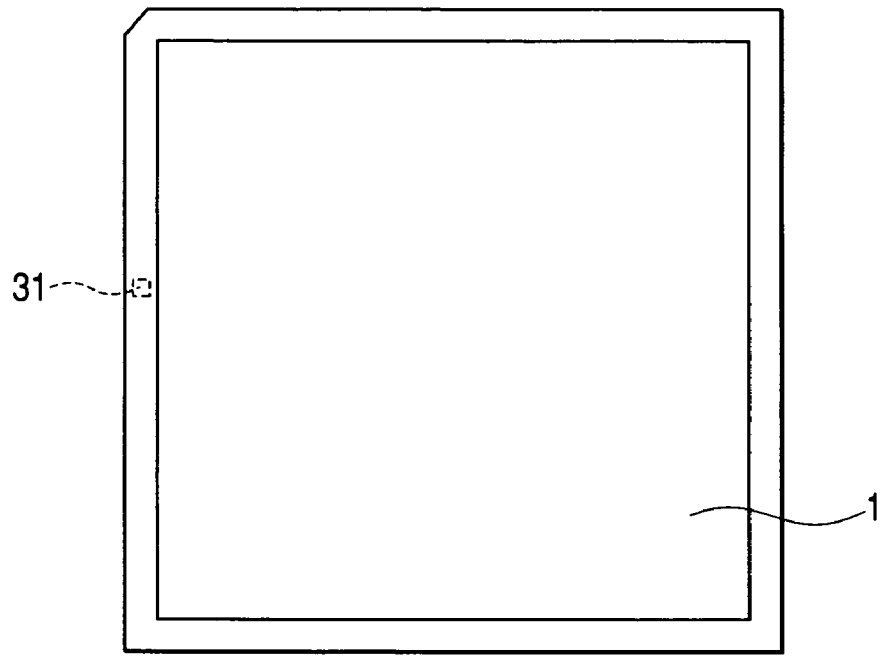
FIG. 13 is a plan view showing a structural example of a tray according to a modification of the first embodiment.
Figure 14:
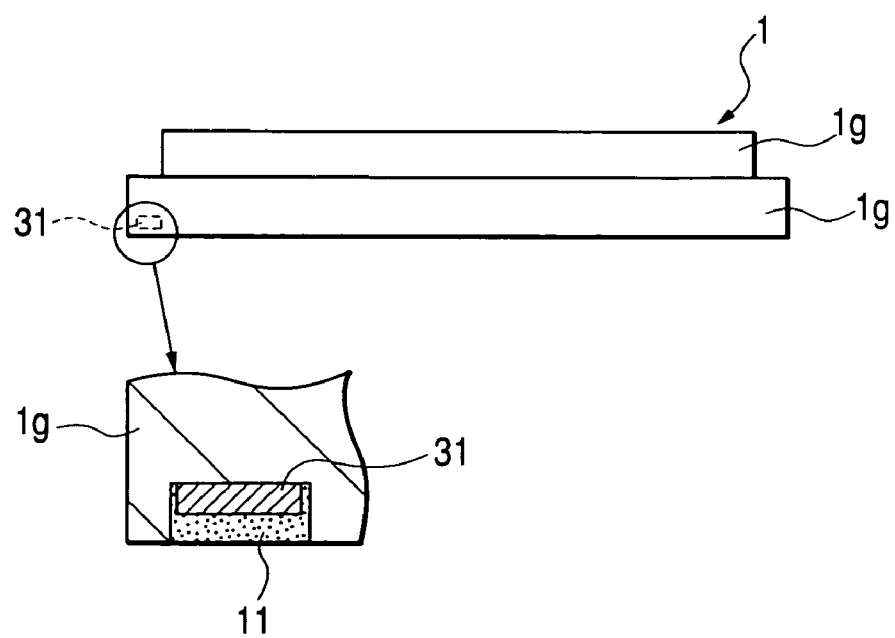
FIG. 14 comprises a side view and an enlarged partial sectional view, showing the structure of the tray according to the modification illustrated in FIG. 13.
Figure 15:
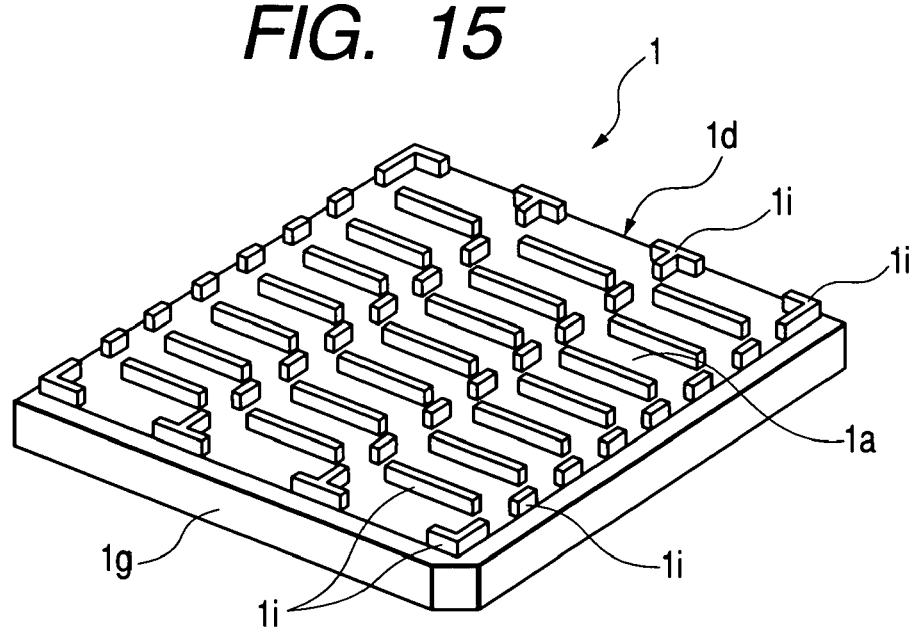
FIG. 15 is a perspective view showing a structural example of a tray according to a modification of the first embodiment.
Figure 16:
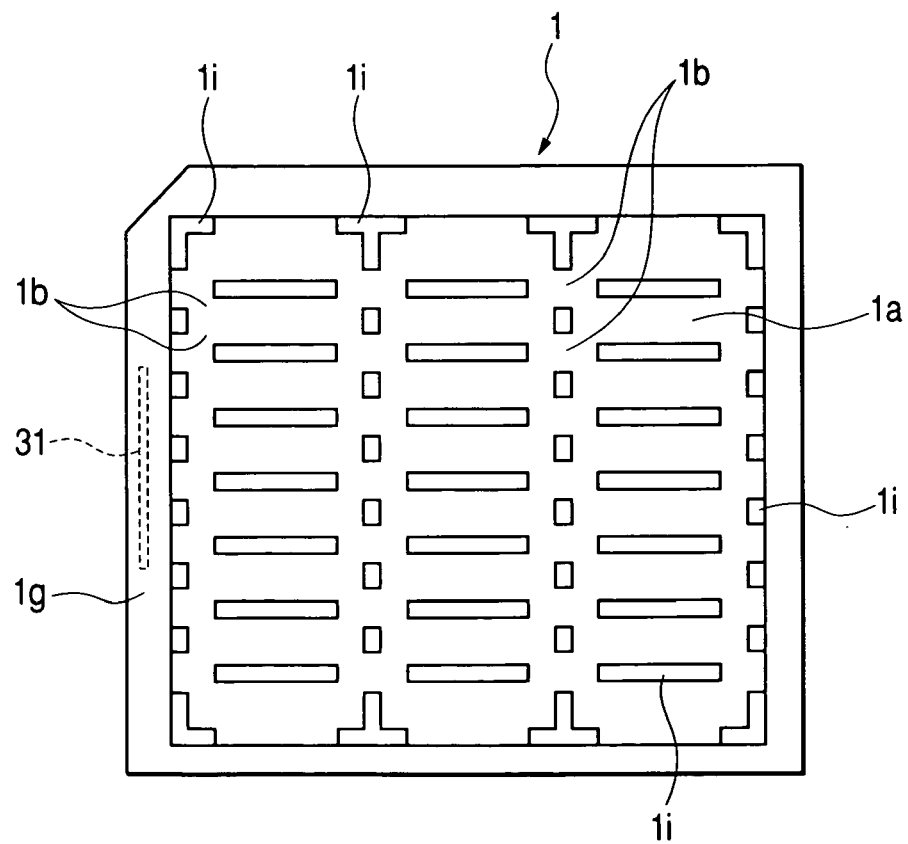
FIG. 16 is a plan view showing the structure of the tray according to the modification illustrated in FIG. 15.
Figure 17:
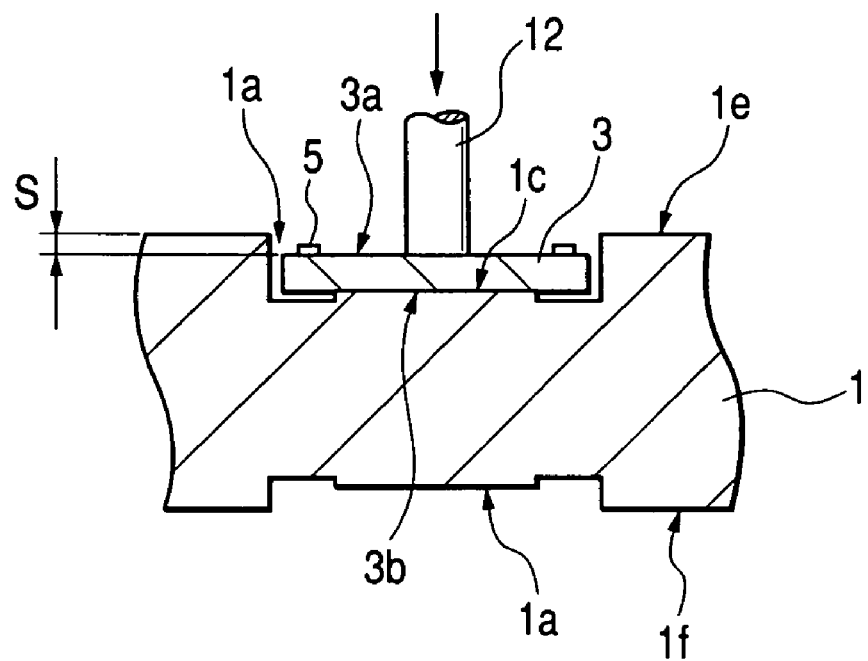
FIG. 17 is an enlarged partial sectional view showing an example of a method for accommodating a semiconductor chip into a tray in the semiconductor device carrying method according to the first embodiment.
Figure 18:
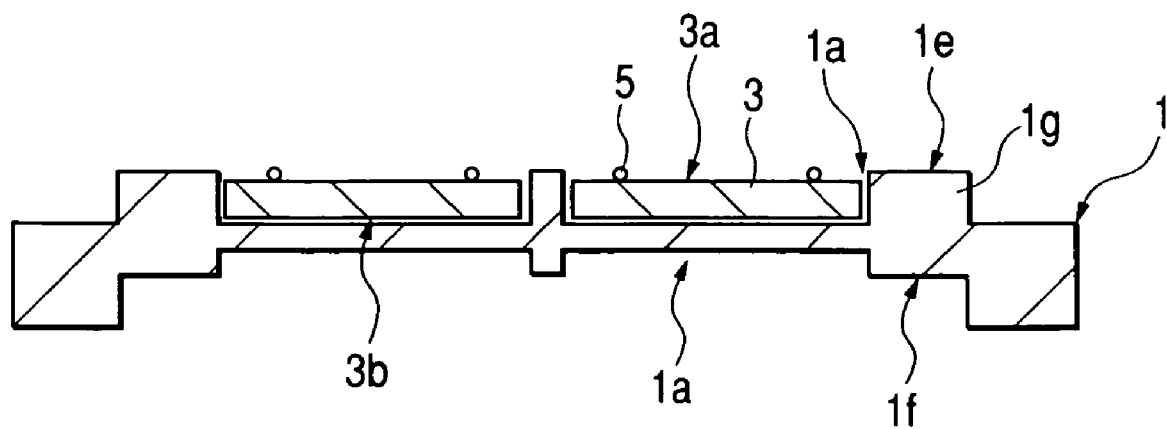
FIG. 18 is a sectional view showing a structural example after accommodation of the semiconductor chip into the tray illustrated in FIG. 17.
Figure 19:
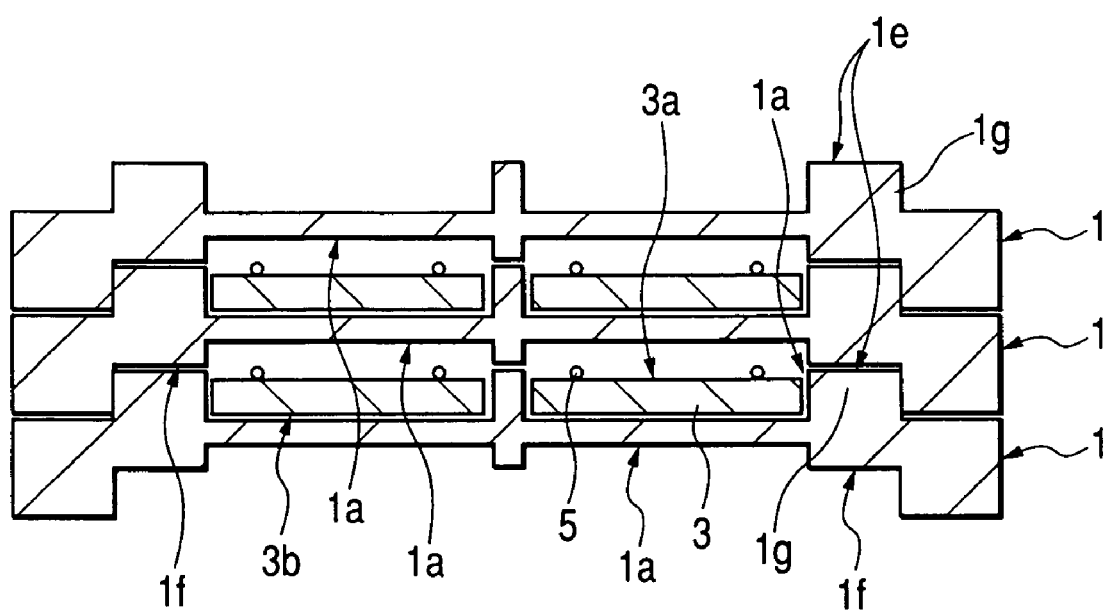
FIG. 19 is a sectional view showing a structure in which the tray illustrated in FIG. 18 is stacked in three stages.
Figure 20:
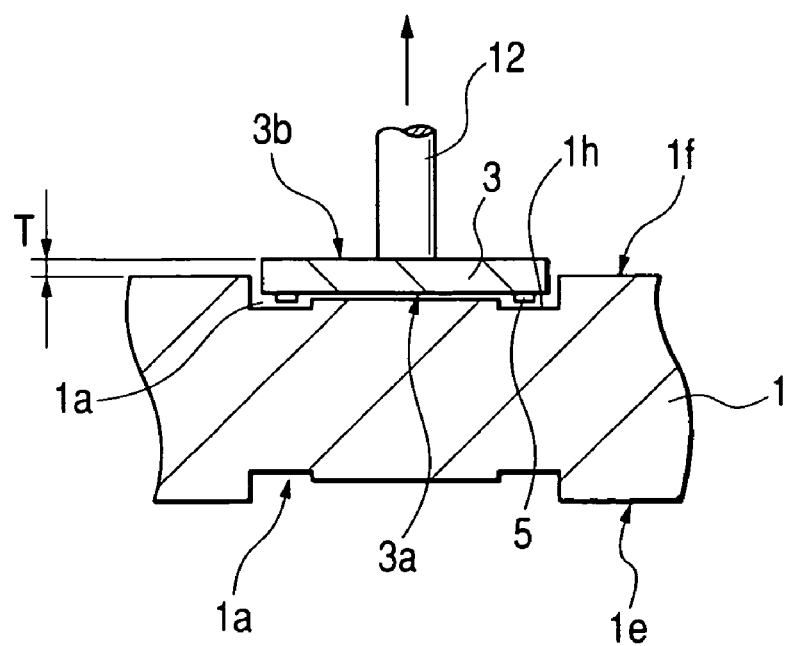
FIG. 20 is an enlarged partial sectional view showing an example of how to take out the semiconductor chip from the tray in the semiconductor device mounting method of the first embodiment.
Figure 21:
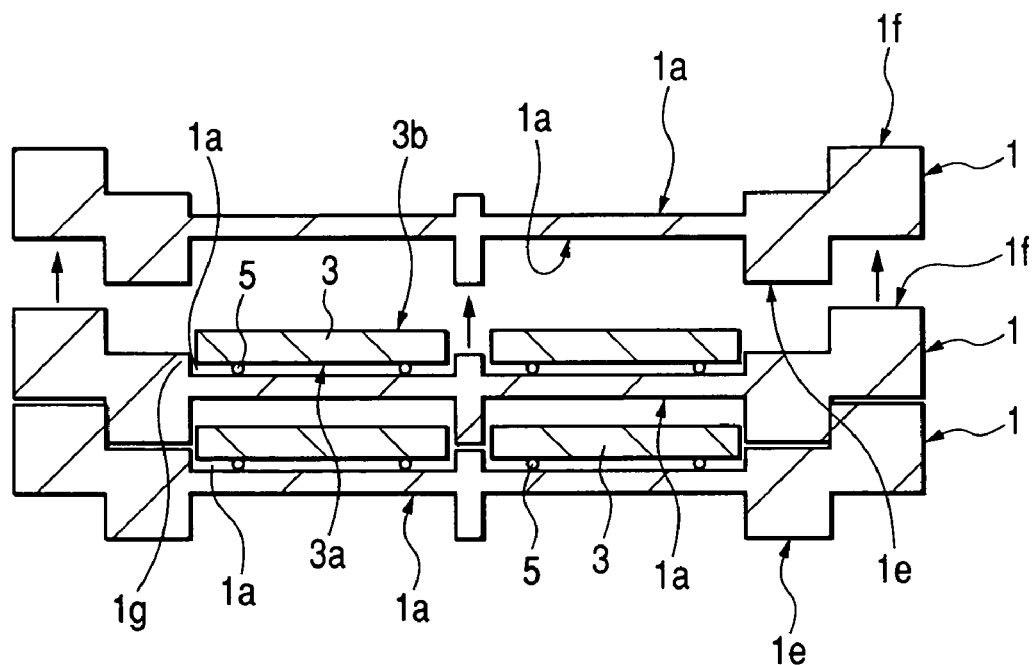
FIG. 21 is a sectional view showing an example of how to take out the semiconductor chip from the stacked state of trays illustrated in FIG. 19.
Figure 22:
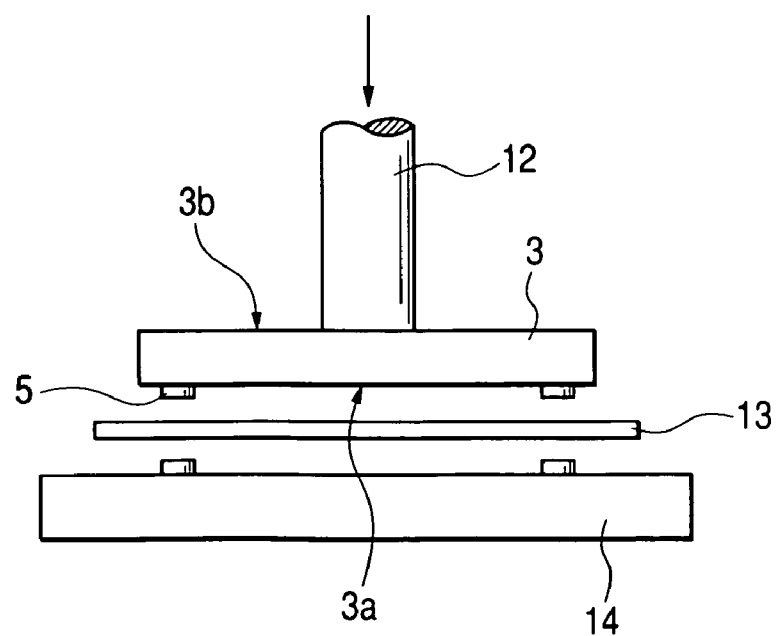
FIG. 22 is a partial side view showing an example of how to mount the semiconductor chip onto a mounting substrate in a semiconductor device mounting method according to the first embodiment.
Figure 23:
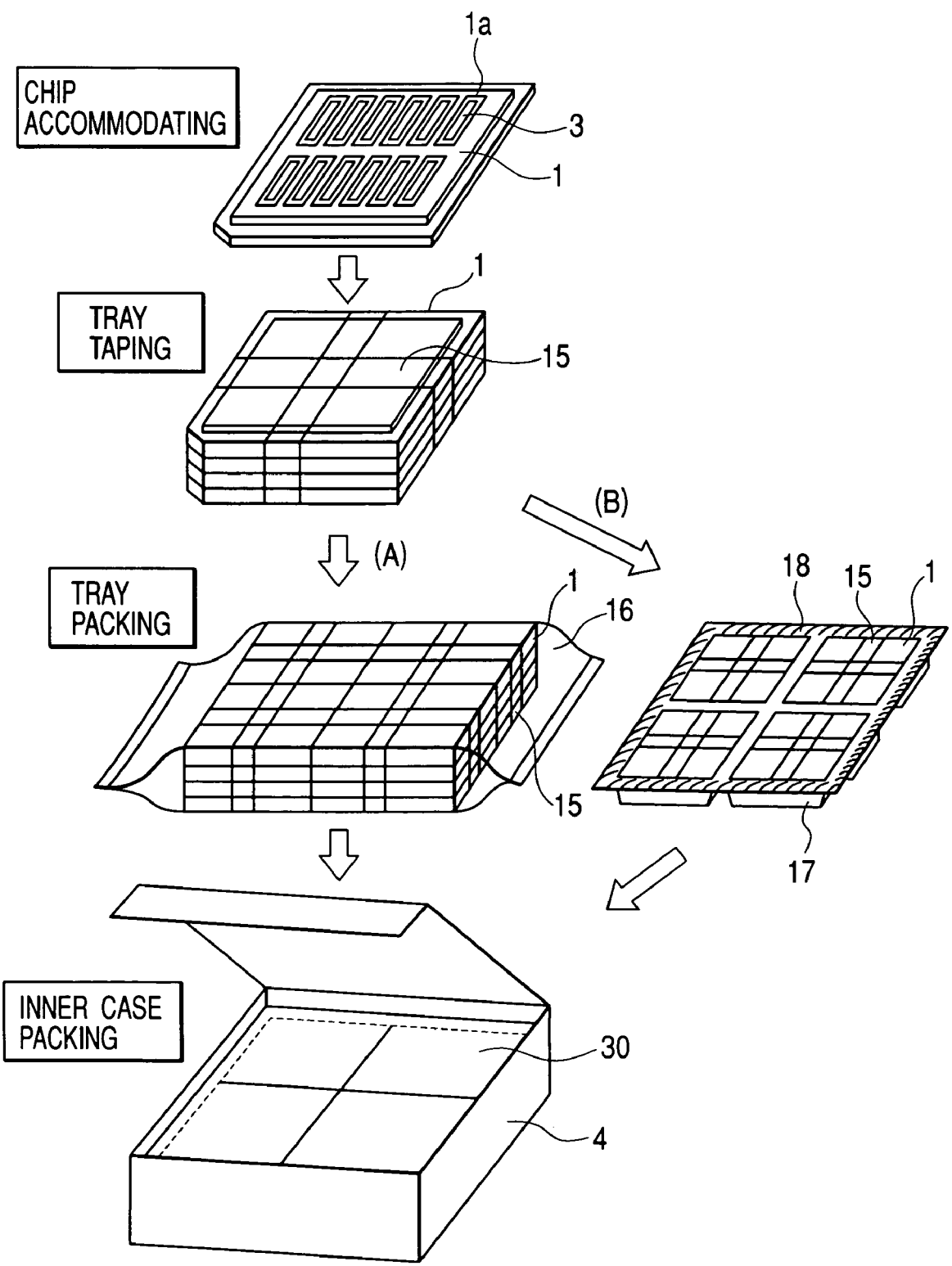
FIG. 23 is a perspective view showing an example of a semiconductor device packing method according to the first embodiment.
Figure 24:
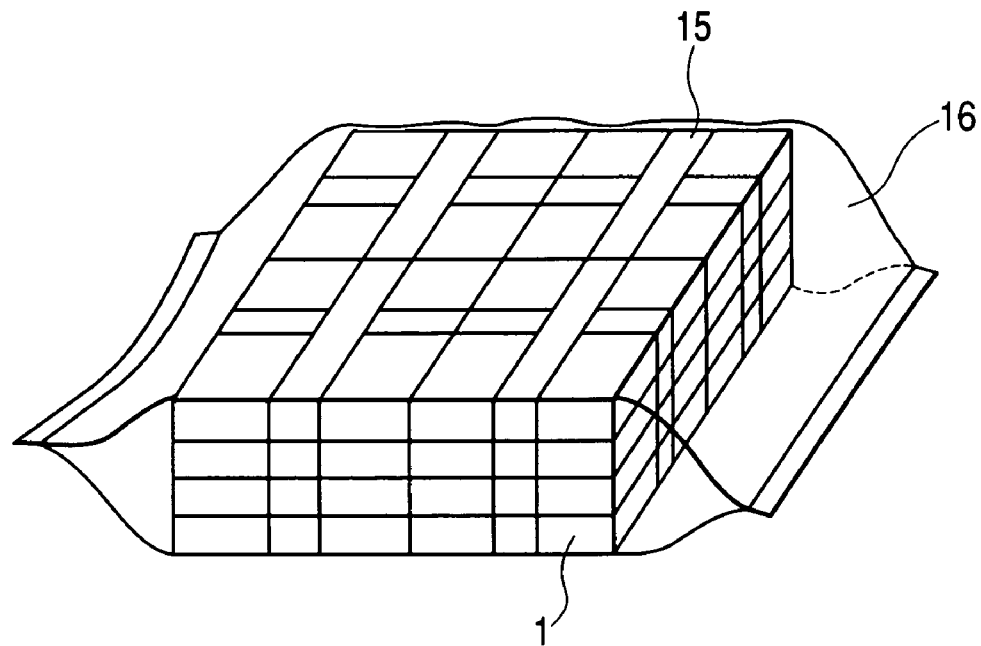
FIG. 24 is a perspective view showing an accommodated state of tray into a moistureproof bag in the packing method illustrated in FIG. 23.
Figure 25:
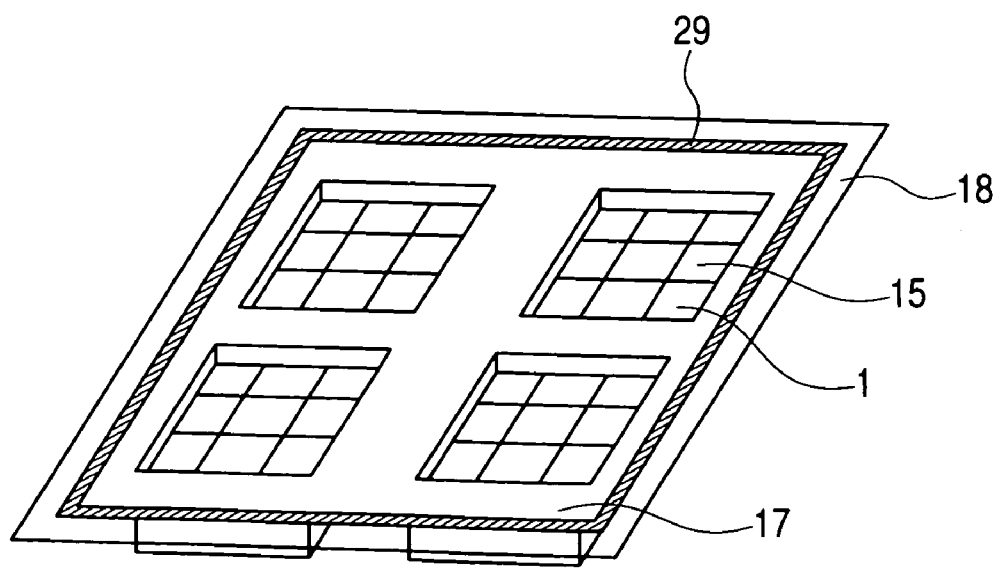
FIG. 25 is a perspective view showing an accommodated state of tray into an embossed case in the packing method illustrated in FIG. 23.
Figure 26:
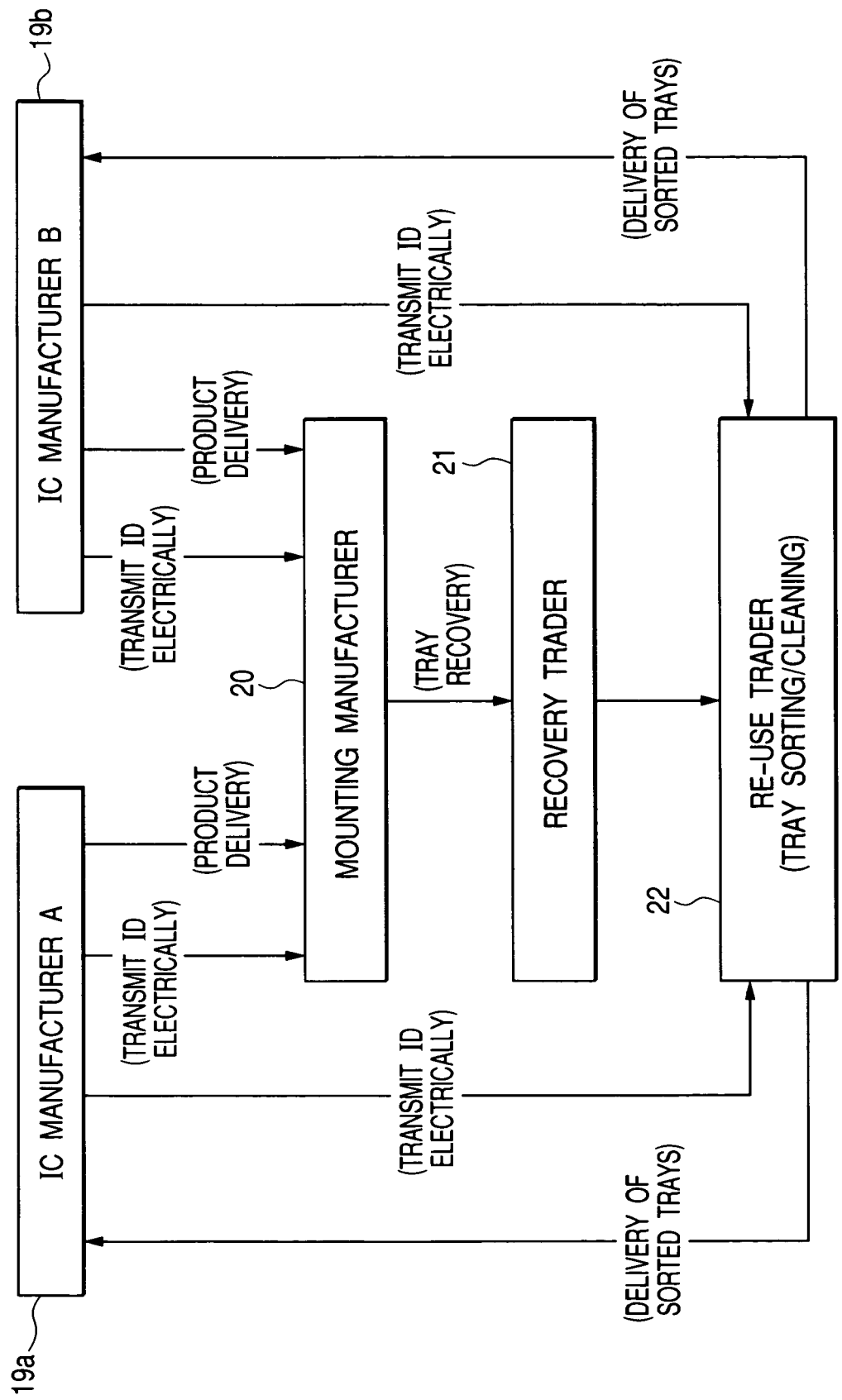
FIG. 26 is a block diagram showing an example of a receptacle flow in a receptacle re-utilizing method according to the first embodiment.
Figure 27:
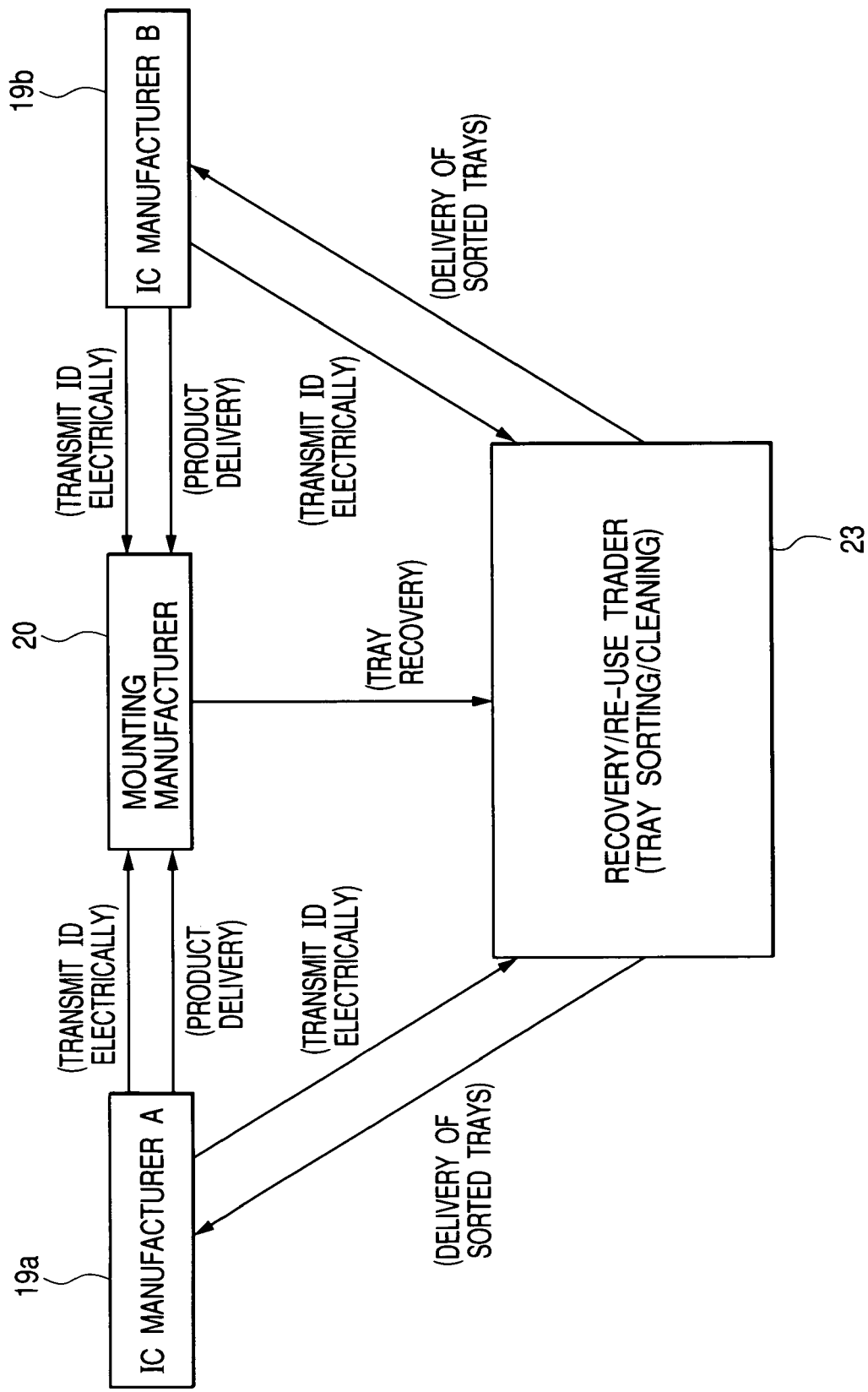
FIG. 27 is a block diagram showing a receptacle flow in a modification of the receptacle re-utilizing method according to the first embodiment.

FIG. 1 is a side view showing a structural example of a tray used in a semiconductor device carrying method according to a first embodiment of the present invention, FIG. 2 is a plan view showing the structure of the tray illustrated in FIG. 1, FIG. 3 is an enlarged plan view showing the structure of a pocket portion of the tray illustrated in FIG. 2, FIG. 4 is a partial sectional view taken along line A-A in FIG. 3 with a chip accommodated in the pocket portion, FIG. 5 is an enlarged sectional view of pocket portions, showing a structural example during conveyance of chips using the tray illustrated in FIG. 1, FIG. 6 is a plan view showing a structural example of an electronic tag, the electronic tag being constituted by a mu-chip with external antenna which is buried in the tray illustrated in FIG. 1, FIG. 7 is a circuit configuration diagram showing an example of a circuit configuration of an electronic tag which is constituted by an antenna built-in type mu-chip, FIG. 8 is a data construction diagram showing a structural example of data in a data storage circuit which is formed in the mu-chip of the electronic tag illustrated in FIG. 7, FIG. 9 is a construction diagram showing an example of in what state the electronic tag illustrated in FIG. 6 is utilized, FIG. 10 is a plan view showing a structural example of a molding die which is used at the time of burying the electronic tag illustrated in FIG. 6 into the tray, FIG. 11 is a sectional view showing the structure of the molding die illustrated in FIG. 10, FIG. 12 is a plan view showing a structural example of a tray having an electronic tag, the electronic tag being constituted by a mu-chip with external antenna fabricated by using the molding die illustrated in FIG. 10, FIG. 13 is a plan view showing a structural example of a tray according to a modification of the first embodiment, FIG. 14 comprises a side view and an enlarged partial sectional view, showing the structure of the tray according to the modification illustrated in FIG. 13, FIG. 15 is a perspective view showing a structural example of a tray according to a modification of the first embodiment, FIG. 16 is a plan view showing the structure of the tray according to the modification illustrated in FIG. 15, FIG. 17 is an enlarged partial sectional view showing an example of a method for accommodating a semiconductor chip into a tray in the first embodiment, FIG. 18 is a sectional view showing a structural example after accommodation of the semiconductor chip into the tray illustrated in FIG. 17, FIG. 19 is a sectional view showing a structure in which the tray illustrated in FIG. 18 is stacked in three stages, FIG. 20 is an enlarged partial sectional view showing an example of a method for taking out the semiconductor chip from the tray in the first embodiment, FIG. 21 is a sectional view showing an example of a method for taking out the semiconductor chip from the stacked state of trays illustrated in FIG. 19, FIG. 22 is a partial side view showing an example of a method for mounting the semiconductor chip onto a mounting substrate in the first embodiment, FIG. 23 is a perspective view showing an example of a semiconductor device packing method according to the first embodiment, FIG. 24 is a perspective view showing an accommodated state of tray into a moistureproof bag in the packing method illustrated in FIG. 23, FIG. 25 is a perspective view showing an accommodated state of tray into an embossed case in the packing method illustrated in FIG. 23, FIG. 26 is a block diagram showing an example of a receptacle flow in a receptacle re-utilizing method according to the first embodiment, and FIG. 27 is a block diagram showing a receptacle flow in a modification of the receptacle re-utilizing method according to the first embodiment.

This first embodiment is concerned with a method for carrying a semiconductor device such as a semiconductor chip or a semiconductor package (e.g., IC chip, LSI chip, IC package, or LSI package), with use of a receptacle (e.g., tray or tape-reel) for accommodating and carrying the semiconductor device, as well as a method for packing the semiconductor device and a method for re-utilizing the receptacle.

In this first embodiment, as an example of the receptacle there is used such a tray 1 as shown in FIGS. 1 and 2, and as an example of an object to be accommodated in the tray 1 there is used a semiconductor chip (semiconductor device) 3.

The tray 1 used in this embodiment is a laminated sheet-like tray which accommodates plural semiconductor chips 3 in a matrix layout. Plural pockets (concave portions) 1a are formed in a matrix layout in both surface and back of the tray 1. With the plural semiconductor chips 3 accommodated respectively in the pockets 1a, the tray 1 is used not only for the storage of the chips or carrying between processes but also for carrying at the time of shipping from the factory concerned to the exterior (e.g., to a mounting manufacturer 20 shown in FIG. 26).

The tray 1 comprises a base portion 1d with plural pockets 1a formed therein in a matrix shape and side walls 1g formed along peripheral edges of the base portion 1d.

In the tray 1 is buried an electronic tag 31 which is constituted by a mu-chip (non-contact recognition type chip) 2 having a memory with non-contact recognizable information stored therein. In the mu-chip 2 of the electronic tag 31 are integrated a plurality of circuits, including communication circuit 2d, read out circuit 2e and data storage circuit (memory circuit) 2f, as shown in FIG. 7. In the data storage circuit 2f are stored information pieces of plural bits "0" and "1" which can be read out.

In the case where the data storage circuit 2f is, for example, a 128-bit ROM (Read Only Memory), a data construction comprises header 2g, application data 2h, and authentication data 2i, as shown in FIG. 8. These information pieces are written during fabrication of the mu-chip 2.

Information on the tray 1 with the electronic tag 31 buried therein or of an object to be accommodated on the tray, such as semiconductor chips 3, can be read by means of a reader 6 used exclusively for data recognition (read), as shown in FIG. 9. More specifically, when there is obtained energy of an electromagnetic wave emitted from the reader 6, the mu-chip 2 of the electromagnetic tag 31 operates and response data (information of "0" or "1") is transmitted to the reader 6 and is then stored in a computer 8 through a read unit 7. In the computer 8 there is made collation with the ID of the tray which has been read and it is possible to read out information and data stored in a host computer 9 such as ID, manufacturer's name, product number, manufacturing date of the tray 1, as well as product name, quantity, and lot number of the accommodated product such as the semiconductor chips 3.

As to the electronic tag 31, there are two types depending on communication distance (information readable distance), which are an electronic tag using a mu-chip 2 with an external antenna 2a such as that shown in FIG. 6 and an electronic tag using an antenna-built-in type mu-chip 2 containing a built-in antenna 2c such as that shown in FIG. 7. The tag 31 using the mu-chip 2 with external antenna 2a is longer in communication distance than the electronic tag 31 using the antenna-built-in type mu-chip 2 and is employable in a wider range, but in point of size the latter is more compact.

The working frequency in the illustrated example is 2.45 GHz, and in the case of the electronic tag 31 using the mu-chip 2 with external antenna 2a shown in FIG. 6, its overall length L is 56 mm, width W is about 1 mm, and the chip size of the mu-chip 2 is 0.01 to 0.5 mm square. In the case of the electronic tag 31 shown in FIG. 7, the chip size is 0.01 to 0.5 mm square.

By accommodating semiconductor devices such as semiconductor chips 3 in the tray 1 having the electronic tag 31 of mu-chip 2 with recognizable information stored therein, and by carrying the tray, it is possible to prevent the generation of dust because paper label is not used and hence possible to realize clean accommodation and carrying of semiconductor devices.

Next, a description will be given below about the structure and other features of the tray 1 used in this first embodiment.

It is preferable that the mu-chip 2 be buried in the tray 1 at a position easy to read such as an outer periphery surface or upper surface of a side wall 1g, whereby the mu-chip can be read (recognized) easily and correctly by the reader 6 in the read unit 7.

As shown in FIG. 3, relief portions 1b are formed respectively in four square corners of each of the pockets 1a formed in the tray 1, whereby corner edges of the semiconductor chip 3 supported within the pocket 1a by a support portion 1c as shown in FIG. 4 can be prevented from contacting and scraping off the corners of the pocket due to vibration or the like during conveyance.

As a result, it is possible to prevent the generation of dust particle within the pocket 1a and there can be realized clean accommodation and carrying of chips on the tray 1.

As a modification having a countermeasure for avoiding contact of corner edges of the semiconductor chip 3 with the corners of each pocket 1a, there may be used a tray 1 of such a structure as shown in FIGS. 15 and 16. In the tray 1 according to the modification shown in FIGS. 15 and 16, an electronic tag 31 constituted by a mu-chip 2 is buried in a side wall 1g of the tray, plural ribs 1i for defining pockets 1a are formed on a base portion 1d, and each of the pockets 1a has relief portions 1b at its four corners.

Therefore, also in the tray 1 shown in FIGS. 15 and 16, corner edges of the semiconductor chip 3 accommodated in each pocket 1a can be prevented from contacting and scraping off the corners of the pocket; as a result, it is possible to prevent the generation of dust particle within each pocket 1a.

Further, plural pockets 1a as concave portions are formed in each of the surface and the back of the tray 1 used in this first embodiment, so when plural such trays 1 are stacked, pockets 1a formed on one side of the underlying tray 1 are covered with pockets 1a formed on an opposite side of the overlying tray 1 which confronts the underlying tray, as shown in the enlarged sectional view of pocket portions of FIG. 5.

For example, FIG. 5 illustrates a structure during conveyance in a stacked state of trays 1 with semiconductor chip 3 accommodated therein. In the same figure, if a lower surface of each tray 1 is assumed to be a back surface 1f and an upper surface thereof is assumed to be a surface 1e, the semiconductor chip 3 accommodated within each pocket 1a formed on the surface 1e side (upper side) of the underlying tray 1 assumes a state in which its main surface 3a faces upward and is covered with the corresponding pocket 1a formed on the back surface 1f side (lower side) of the overlying tray 1.

According to the tray structure adopted in this first embodiment, each pocket 1a on the surface 1e side of one tray 1 and each pocket 1a on the back surface 1f side thereof are different in depth. That is, in the trays 1 shown in FIG. 5, if the depth of the pocket 1a on the surface 1e side (upper side) is P and that of the pocket 1a on the back surface 1f side (lower side) is Q, there exists a relation of P>Q.

Consequently, in a stacked state of trays 1, the distance (R) between the main surface 3a of the semiconductor chip 3 and the bottom of the pocket 1a in the overlying tray 1 which covers the main surface 3a is shorter in case of P>Q than in case of P=Q, whereby vertical movements of the semiconductor chip 3 within the pocket 1a can be diminished during conveyance and it is possible diminish a rebounding shock on the semiconductor chip during conveyance.

Further, at the time of taking out each semiconductor chip 3 from the tray 1, for example, in a mounting manufacturer 20 shown in FIG. 26, the back surface 3b side of the semiconductor chip 3 can be projected from the pocket upper portion in the tray 1 as in FIG. 20 by inverting the tray 1 which is in such a stacked state as shown in FIG. 5, because of the relation P>Q.

As a result, at the time of chucking and taking out each semiconductor chip 3 from the tray 1, side faces of the semiconductor chip become difficult to abut an upper portion of the associated pocket in the tray, whereby the chip can be taken out more easily.

Although in the example shown in FIG. 5, the pockets 1a formed on the surface 1e side (upper side) are deeper than the pockets 1a formed on the back surface 1f side (lower side), the pocket depth relation between the surface and the back side of the tray 1 is not limited to the illustrated example, but may be vice versa, provided the relation should be satisfied such that the object to be accommodated is received in the deeper pocket 1a during conveyance thereof and, when to be taken out, is received in the shallower pocket 1a by inverting the tray 1.

Moreover, as shown in FIG. 5, in the lower pocket 1a (the pocket 1a which covers the accommodated object from above) formed in the tray 1 which overlies the accommodated object during conveyance, there is formed an electrode relief portion 1h which is a recess for escape from bump electrodes 5 on the semiconductor chip 3 at the time of inversion of the tray 1 when to be taken out.

Consequently, it is possible to prevent damage of the bump electrodes 5 upon inversion of the tray 1. The shape of the electrode relief portion 1h is not limited to the shape shown in FIG. 5 insofar as it is a shape corresponding to and escaping from the arrangement of the bump electrodes 5. It may be such a shape as shown in FIG. 2.

It is preferable that the tray 1 used in this first embodiment be able to prevent electric charging and be formed of a material not containing carbon particles. For example, AAS (acrylonitrile acrylate styrene) or ABS (acrylonitrile butadiene styrene) is preferred.

In this case, since carbon particles are not contained in the material of the tray 1, it is possible to prevent the generation of dust particle and hence possible to realize clean accommodation and carrying of semiconductor devices on the tray 1.

Next, with reference to FIGS. 10 to 12, a description will be given below about how to bury the electronic tag 31 of the mu-chip 2 into the tray 1 at the time of fabrication of the tray.

Reference will first be made to a method for burying the mu-chip 2 with external antenna 2a. As shown in FIGS. 10 and 11, the electronic tag 31 constituted by the mu-chip 2 having the external antenna 2a is disposed on a lower die half 10b of a resin molding die 10, followed by clamping by an upper die half 10a. Subsequently, molding resin is poured from a gate 10c as a resin inlet shown in FIGS. 10 and 11 to effect resin molding.

After curing of the resin, the upper and lower die halves 10a, 10b are opened and the resulting resin-molded product is taken out from the interior. Thus, the tray shown in FIG. 12 is completed.

In the external antenna 2a there are formed slits 2b for obtaining a predetermined antenna length, as shown in FIG. 6.

On the other hand, for burying the antenna-built-in type mu-chip 2 into the tray 1, the mu-chip 2 is disposed in the same way as in FIG. 11, followed by resin molding as in FIG. 14, and thereafter potting resin 11 is applied from above the mu-chip 2 to complete burying of the electronic tag 31 of the antenna-built-in type mu-chip 2, as shown in FIG. 13.

Next, a description will be given below about a semiconductor device accommodating and carrying method according to this first embodiment, which method is carried out using the tray 1 with the electronic tag 31 buried therein.

As shown in FIGS. 17 and 18, the tray 1 is disposed so that its surface 1e side faces up. Thereafter, semiconductor chips 3 which have each been chucked and carried with a vacuum pincette 12 are accommodated one by one into the pockets 1a on the surface 1e side in such a manner that the main surface 3a of each semiconductor chip 3 with the bump electrodes 5 formed thereon faces up. The pockets 1a formed on the surface 1e side are deeper than the pockets 1a formed on the back surface 1f which is located on the lower side. Consequently, after each semiconductor chip 3 has been accommodated in the corresponding pocket 1a, the main surface 3a of the chip is in a retracted state from the upper surface of the pocket. For example, as shown in FIG. 17, the distance (S) from the upper surface of the pocket 1a to the main surface 3a of the semiconductor chip 3 is 100 μm or so.

Thereafter, as shown in FIG. 19, stacking of trays 1 and accommodation of semiconductor chip 3 are repeated to obtain a stack of trays. In this case, as to the top stage of tray 1, semiconductor chips 3 are not accommodated thereon because the top tray serves as a cover.

After the accommodation of plural semiconductor chips 3, the trays 1 are carried in a stacked state in which the tray surface 1e side faces up. Consequently, in each pocket 1a, the main surface 3a of each semiconductor chip 3 also faces up during the conveyance. The conveyance is, for example, carrying between processes in the factory concerned or shipping to the exterior of the factory.

In this first embodiment it is preferable that the size of dust particle present in the environment (atmosphere) of the semiconductor device accommodating work be not larger than 5 μm. If this preferred condition is satisfied, it is possible to prevent the inclusion of dust particle which poses a problem at the time of accommodating semiconductor chips 3 onto the tray 1, and therefore it is possible to realize a clean accommodation of semiconductor devices.

Further, by performing the foregoing conveyance of trays 1 in this state of clean accommodation, it is possible to realize a clean conveyance of trays.

In the case where the semiconductor device as an object to be accommodated in the tray 1 is a resin-sealed type semiconductor package with the semiconductor chip 3 incorporated therein, it is preferable that the size of dust particle present in the semiconductor device accommodating environment (atmosphere) for the tray 1 be not larger than 100 μm, e.g., 70 to 100 μm. However, in the case of a semiconductor device (e.g., wafer-level CSP) which is fabricated by forming re-wiring in the state of a semiconductor wafer, it is preferable that the size of dust particle present in the semiconductor device accommodating environment (atmosphere) be, for example, not larger than 50 μm.

If this preferred condition is satisfied, it is possible to prevent the inclusion of such dust particle as causes a problem at the time of accommodating resin-sealed type semiconductor packages onto the tray 1, and hence it is possible to realize clean accommodation. Besides, by performing in this state the foregoing conveyance of the tray 1 it is possible to realize clean conveyance.

Next, the following description is now provided about a semiconductor device mounting method according to this first embodiment. After plural semiconductor chips 3 have been accommodated onto such a tray 1 with the electronic tag 31 of the mu-chip 2 buried therein as shown in FIG. 1 and after plural such trays 1 have been shipped and carried in such a stacked state as shown in FIG. 19, the plural semiconductor chips 3 are taken out from each of the trays 1 and thereafter each mounted onto a substrate by the semiconductor device mounting method according to this first embodiment. For example, as shown in FIG. 26, trays 1 accommodating semiconductor chips 3 shipped from an IC manufacturer A 19a and an IC manufacturer B 19b are delivered to a mounting manufacturer 20, which in turn takes out the semiconductor chips 3 and mount each of them onto a substrate.

First, in the mounting manufacturer 20 which has received the trays 1, information such as ID of the mu-chip 2 of the electronic tag 31 in each of the received trays 1 is read by the reader 6 in the read unit 7 as shown in FIG. 9 and the read information is collated with information such as ID provided separately from the IC manufacturer 19 to check if ordered products have actually been delivered correctly or not.

If the answer is affirmative, the trays 1 which are in such a stacked state as shown in FIG. 19 are inverted and semiconductor chips 3 are received into the back surface 1f-side pockets 1a of each tray 1 located above the semiconductor chips. Thereafter, the tray 1 which overlies the semiconductor chips 3 is removed, allowing back surfaces 3b of the semiconductor chips 3 to be exposed.

In this case, since the back surface 1f-side pockets 1a which accommodate the semiconductor chips 3 therein are shallower than the surface 1e-side pockets, the back surfaces 3b of the semiconductor chips 3 project from upper portions of the back surface 1f-side pockets 1a. A projection quantity (T) of the back surface 3b of each semiconductor chip 3 from the upper surface of the corresponding pocket 1a is about half of thickness (for example, 400 μm or 550 μm) of the semiconductor chip 3.

Subsequently, the semiconductor chips 3 are picked up (taken out) one by one while chucking the back surface 3b of each semiconductor chip with the vacuum pincette 12 as shown in FIG. 20 and are transferred onto a substrate such as a glass substrate 14 as shown in FIG. 22. In this case, the back surface 3b of each semiconductor chip 3 is projecting from the upper portion of the pocket 1a, so at the time of chucking the semiconductor chip 3 and taking it out from the tray 1, side faces of the semiconductor chip are difficult to strike against the upper portion of the corresponding pocket in the tray 1 and thus the semiconductor chip 3 can be taken out more easily.

The substrate is not limited to the glass substrate 14, but may be a printed wiring board such as a glass fiber-based epoxy resin board or a film substrate.

Thereafter, as shown in FIG. 22, an anisotropic conductive sheet 13 or the like is disposed between the glass substrate 14 and the semiconductor chip 3 and the chip is mounted on the glass substrate, for example, by thermocompression bonding or compression bonding.

In the semiconductor device mounting work according to this first embodiment it is preferable that the size of dust particle present in the mounting environment (atmosphere) be not larger than 5 μm. If this preferred condition is satisfied, it is possible to prevent dust particle from adhering to the semiconductor chips 3 and the tray 1 which foreign matter would cause a problem at the time of mounting the semiconductor chips onto the substrate, and hence it is possible to realize a clean mounting of the semiconductor chips 3.

In the case where each semiconductor device to be accommodated on the tray 1 is a resin-sealed type semiconductor package with the semiconductor chip 3 incorporated therein, it is preferable that the size of dust particle present in the semiconductor device mounting environment (atmosphere) for the substrate be not larger than 100 μm, e.g., 70 to 100 μm. However, in the case of a semiconductor device fabricated by forming re-wiring in the state of a semiconductor wafer, it is preferable that the size of dust particle present in the semiconductor device mounting environment (atmosphere) be, for example, not larger than 50 μm.

By meeting this preferred condition it is possible to prevent the adhesion of such dust particle as would cause a problem to the semiconductor package at the time of taking out the resin-sealed type semiconductor package and mounting it onto the substrate, and hence possible to realize a clean semiconductor device mounting work.

Next, a description will be given below of a method for packing semiconductor devices such as semiconductor chips 3 or semiconductor packages. The packing method is carried out using the tray 1 with the mu-chip 2 buried therein.

First, as shown in FIG. 23, plural trays 1 each having the mu-chip 2 buried therein are provided, then, in accordance with the foregoing semiconductor device accommodating method, semiconductor chips 3 are accommodated in the pockets 1a formed in the trays 1. In this case, when the accommodation of semiconductor chips 3 in the first stage of tray 1 is completed, another tray 1 is stacked thereon and semiconductor chips 3 are accommodated in the second stage of tray 1. In this way a predetermined number of semiconductor chips 3 are accommodated onto the trays 1 thus stacked.

Thereafter, tray taping is performed. More specifically, the stacked trays 1 are fixed by taping. In this case, it is preferable to use a tape 15 formed of PET (polyethylene terephthalate). Further, it is preferable for the tape 15 to have been produced in a clean environment, for example, in an environment wherein the size of dust particle present therein is not larger than 5 μm (but if the semiconductor devices accommodated on the trays are resin-sealed type semiconductor packages, the size of dust particle present is not larger than 100 μm).

By fixing the stacked trays 1 with tape 15, on comparison with the conventional fixing with clip, it is possible to prevent the generation of dust particle due to wear between the clip and the trays, thus making it possible to realize a clean packing work.

Subsequently, tray packing is conducted. More specifically, the trays 1 in a stacked state after taping are stored into a moistureproof bag 16 or an embossed case 17 and is sealed. A tray packing (A) is with trays 1 accommodated into the moistureproof bag 16, the details of which are shown in FIG. 24. On the other hand, a tray packing (B) is with trays 1 accommodated into the embossed case 17, the details of which are shown in FIG. 25.

Both packings are sealed by heating. For example, the moistureproof bag 16 is formed mainly from aluminum. The embossed case 17 is for example 0.7 to 1 mm thick and has a cover film 18 of aluminum foil which is sealed by heat seal 29 shown in FIG. 25. The moistureproof bag 16 is applicable no matter which of the semiconductor chip 3 and a semiconductor package the semiconductor device as an object to be accommodated may be, but as to the embossed case 17, it is preferable that the same case be applied to the case where the semiconductor device as an object to be accommodated is the semiconductor chip 3, because the embossed case itself is apt to become large.

No matter which of the moistureproof bag 16 and the embossed case 17 may be used, it is preferable to use such a moistureproof bag 16 or a cover film 18 of aluminum foil and an embossed case 17 as has been fabricated in a clean environment, e.g., an environment wherein the size of dust particle present therein is not larger than 5 μm or not larger than 100 μm. By so doing, it is possible to realize a clean packing for semiconductor devices.

Since the tray 1 used has the mu-chip 2 with recognizable information stored therein, it is possible to eliminate paper label from the interior of the moistureproof bag 16 and hence possible to prevent the occurrence of a dust particle defect.

Thereafter, inner case packing is conducted. To be more specific, the stacked trays 1 accommodated into the moistureproof bag 16 or the embossed case 17 in tray packing are accommodated into an inner case 4, then covered with a buffer material 30 and packed.

Subsequently, the inner case is inserted into an outer case for shipping.

Next, a description will be given of a receptacle re-utilizing method according to this first embodiment. The re-utilizing method is for re-utilizing such receptacles as trays 1 with mu-chip 2 buried therein and is applied to the semiconductor device accommodating and carrying method and the semiconductor device mounting method according to this first embodiment.

As shown in FIG. 26, in the IC manufacturers A 19a and B 19b, the trays 1 accommodating semiconductor devices such as semiconductor chips 3 and packed by such a semiconductor device packing method as shown in FIG. 23 are shipped to the mounting manufacturer 20. Further, the IC manufacturers A 19a and B 19b transmit ID of the shipping trays 1 electrically to the mounting manufacturer 20 and a re-use trader 22.

Thereafter, in the mounting manufacturer 20, the semiconductor chips 3 are taken out from the delivered trays 1 and are mounted onto a substrate such as the glass substrate 14 shown in FIG. 22. At this time, first, the information of the electronic tag 31 in each tray 1 is read by the reader 6 in the read unit 7 shown in FIG. 9 and is then collated with information such as ID transmitted electrically from the IC manufacturers A 19*a* and B 19*b* to check whether the ordered products have actually been delivered or not.

Subsequently, in the mounting manufacturer 20, the semiconductor chips 3 are taken out from each tray 1 by such a method as shown in FIGS. 20 and 21 for example and are then mounted on a substrate such as the glass substrate 14 by the method shown in FIG. 22.

Thereafter, a recovery trader 21 recovers plural trays 1 of various manufacturers which have become empty after use in the mounting manufacturer 20, which recovered trays 1 are then sent from the recovery trader 21 to the re-use trader 22. The re-use trader 22 sorts the plural trays 1 according to manufacturers. At this time, information of the mu-chip 2 of the electronic tag 31 buried in each tray 1 is read by the reader 6 in the read unit 7 and is collated with information such as ID transmitted separately from the IC manufacturers A 19*a* and B 19*b*. In this way the recovered trays 1 are sorted according to IC manufacturers (A 19*a* and B 19*b*).

Further, in the re-use trader 22, the trays 1 are subjected, after or before the sorting, to cleaning such as ultrasonic cleaning (ultrasonic wave is applied to a vessel containing pure water to clean an object to be cleaned), wet cleaning, or air blowing.

(1) The re-use trader 22 checks each tray 1 for flaw or damage visually and discards trays not coming up to a predetermined standard as a result of the inspection. Further, (2) the re-use trader 22 discards trays having elapsed a predetermined period (about one to three years) from their manufacturing dates.

After the sorting of trays 1, the sorted trays are delivered to the IC manufacturers (A 19*a* and B 19*b*) as possessors of the trays.

The IC manufacturers A 19*a* and B 19*b* re-utilize the delivered trays 1.

In the method for re-utilizing the trays 1 (receptacles) according to this first embodiment, since each tray 1 is provided with the electronic tag 31 of the mu-chip 2 with non-contact recognizable information stored therein, the re-use trader 22 and the recovery trader 21 can sort trays 1 not visually but by non-contact read (recognition) using the reader 6, so that the trays 1 can be sorted easily and correctly according to manufacturers.

Although in FIG. 26 the re-use trader 22 and the recovery trader 21 are different traders, both may be combined as a recovery/re-use trader 23 which performs both recovery and sorting of trays 1 like a modification illustrated in FIG. 27.

In this case, information such as ID of each tray 1 is transmitted electrically from the IC manufacturers A 19*a* and B 19*b* to the mounting manufacturer 20 and the recovery/re-use trader 23. The recovery/re-use trader 23 recovers used empty trays 1 from the mounting manufacturer 20, then sorts the recovered trays 1 according to manufacturers and cleans them. Thereafter, the recovery/re-use trader 23 delivers the sorted trays 1 to the IC manufacturers A 19*a* and B 19*b*, which in turn re-utilize the received trays 1.

Although two IC manufacturers A 19*a* and B 19*b* have been described above, the same operations as above are performed also in the case where there are three or more IC manufacturers.

Second Embodiment

Figure 28:
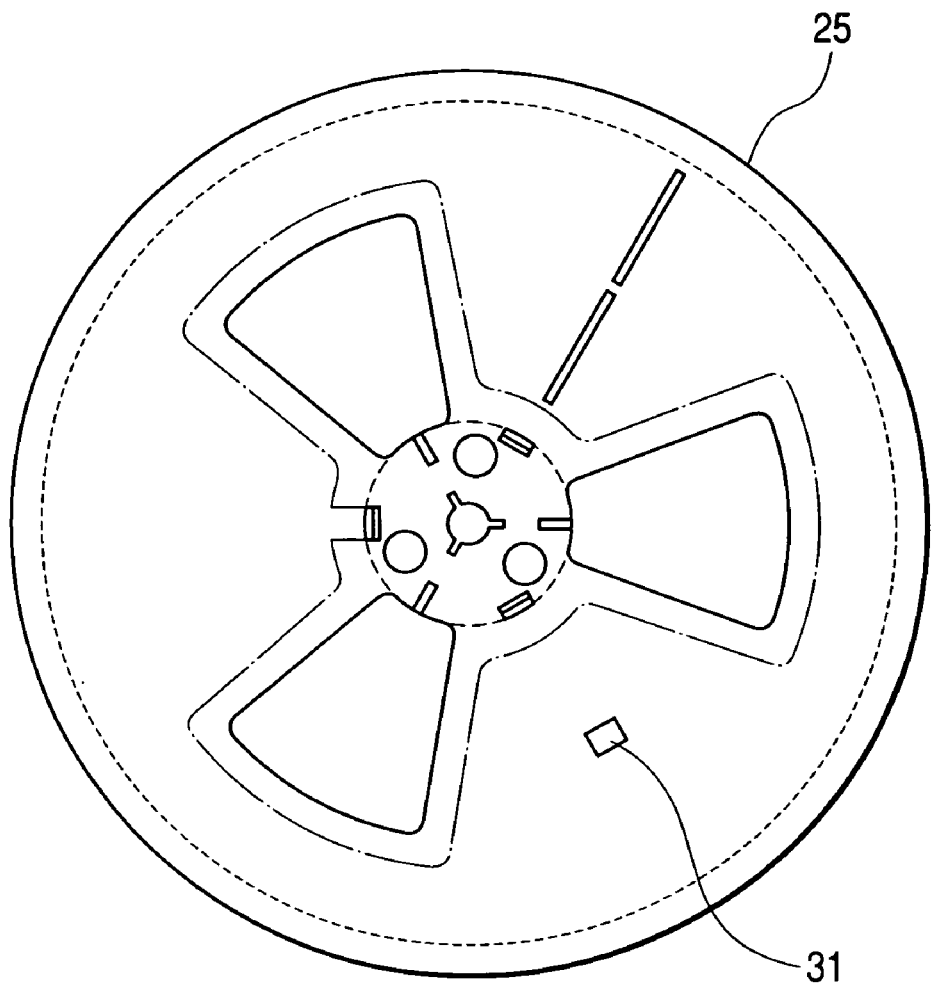
FIG. 28 is a front view showing a structural example of a reel in a tape-reel (receptacle) used in a semiconductor device carrying method according to a second embodiment of the present invention.
Figure 29:
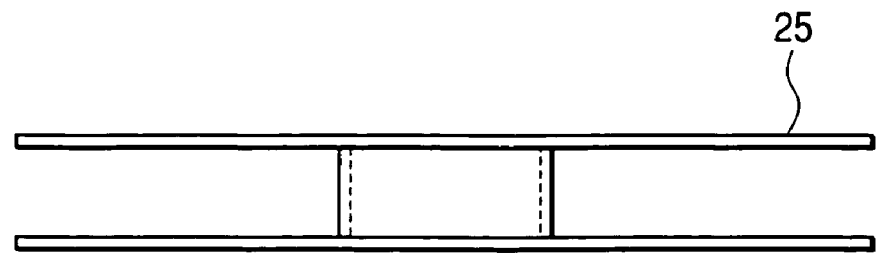
FIG. 29 is a side view showing the structure of the reel illustrated in FIG. 28.
Figure 30:
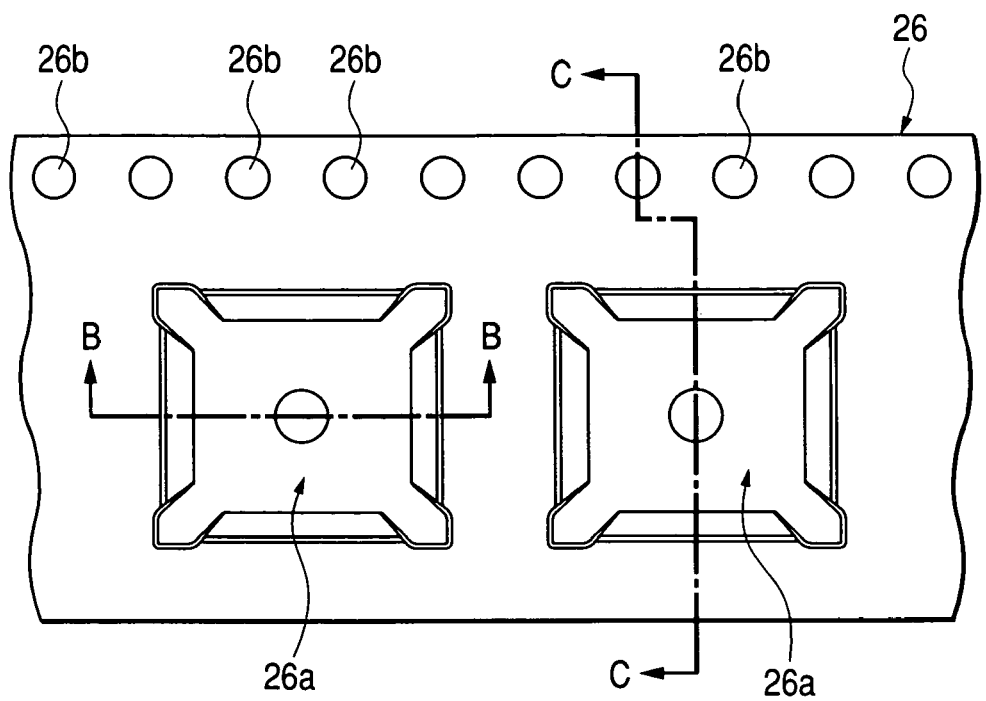
FIG. 30 is an enlarged partial plan view showing a structural example of a carrier tape to be wound round the reel illustrated in FIG. 28.
Figure 31:
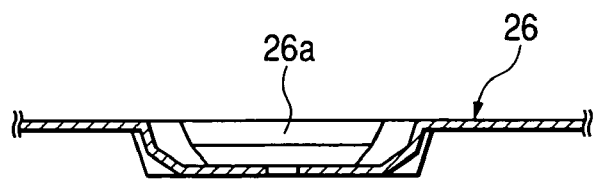
FIG. 31 is a partial sectional view showing a sectional structure taken along line B-B in FIG. 30.
Figure 32:
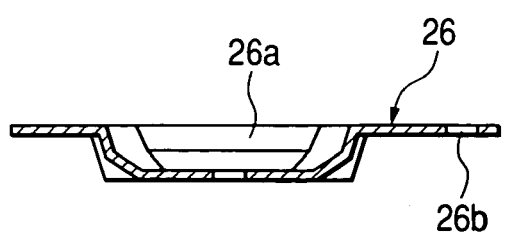
FIG. 32 is a partial sectional view showing a sectional structure taken along line C-C in FIG. 30.
Figure 33:
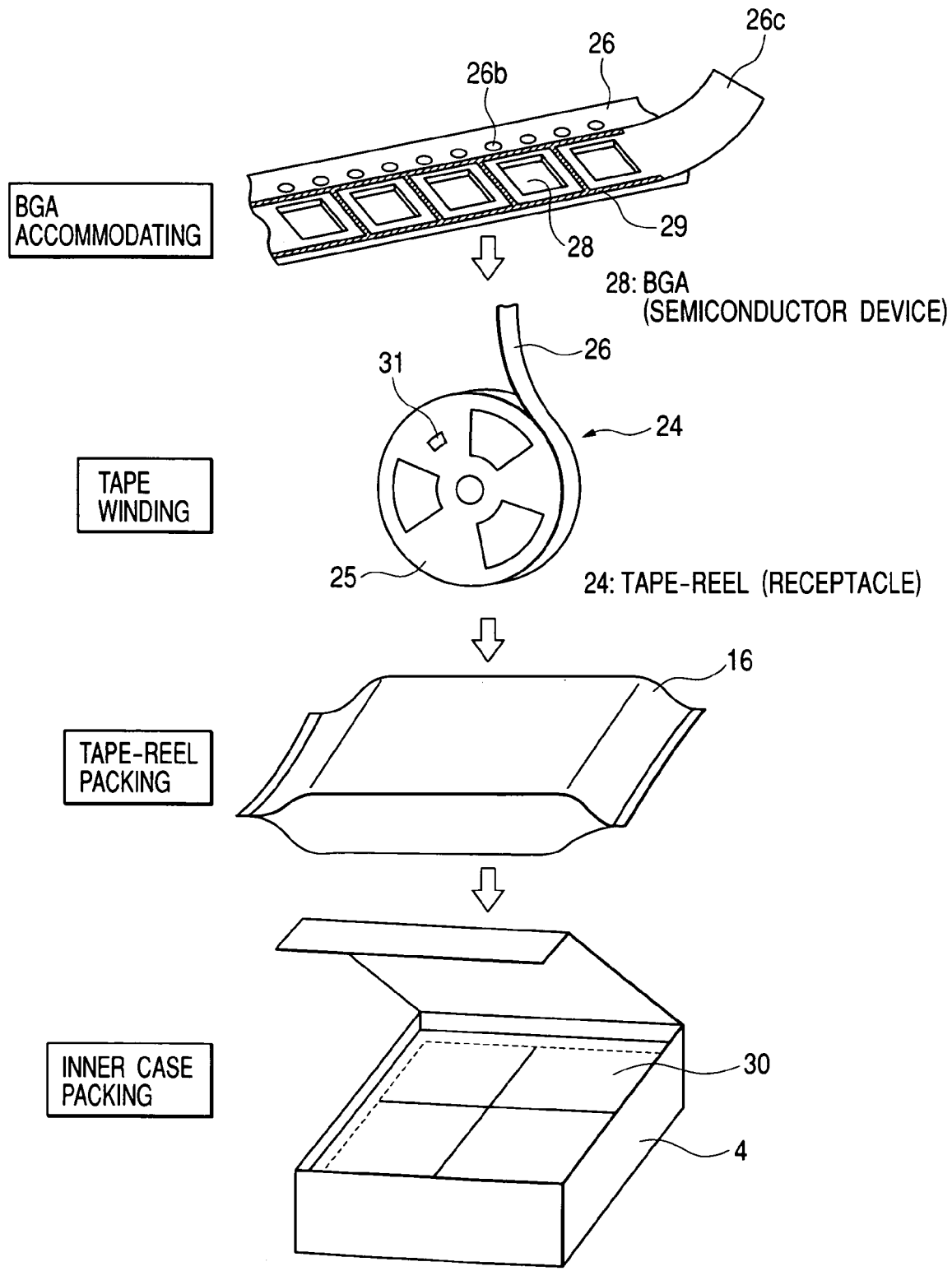
FIG. 33 is a perspective view showing an example of a semiconductor device packing method according to the second embodiment of the present invention.

FIG. 28 is a front view showing a structural example of a reel in a tape-reel (receptacle) used in a semiconductor device carrying method according to a second embodiment of the present invention, FIG. 29 is a side view showing the structure of the reel illustrated in FIG. 28, FIG. 30 is an enlarged partial plan view showing a structural example of a carrier tape to be wound round the reel illustrated in FIG. 28, FIG. 31 is a partial sectional view showing a sectional structure taken along line B-B in FIG. 30, FIG. 32 is a partial sectional view showing a sectional structure taken along line C-C in FIG. 30, and FIG. 33 is a perspective view showing a semiconductor device packing method according to the second embodiment.

In this second embodiment a tape-reel 24 shown in FIG. 33 is used as a modification of the receptacle other than tray.

The tape-reel 24 (receptacle) comprises a carrier tape 26 shown in FIGS. 30 to 32 which can accommodate plural objects to be accommodated and a reel 25 shown in FIGS. 28 and 29 which is for winding the carrier tape 26 thereon. An electronic tag 31 constituted by a mu-chip 2 which permits non-contact read (recognition) of information stored therein is buried in a side face of the reel 25.

The carrier tape 26 shown in FIGS. 30 to 32 is used for accommodating BGA (Ball Grid Array) 28 shown in FIG. 33. Plural pockets (concave portions) 26*a* are formed in a row at approximately equal pitches in the longitudinal direction of the tape, and semiconductor devices such as BGAs 28 are accommodated in the pockets 26*a*. After the accommodation, the pockets 26*a* are covered with a cover film 26*c* of urethane, followed by heat-sealing to seal the interior of each pocket 26*a* in a nearly complete manner.

Plural guide holes 26*b* are formed at approximately equal pitches along one end in the transverse direction of the carrier tape 26 and in parallel with the pocket row. The guide holes 26*b* are used as feed guides during movement of the carrier tape 26.

The following description is now provided about a semiconductor device packing method shown in FIG. 33 which uses the tape-reel 24 according to this second embodiment.

First, as in FIG. 33 which illustrates accommodation of BGAs, there are provided the BGA accommodating carrier tape 26 shown in FIG. 30 and the reel 25 shown in FIG. 28 which can wind the carrier tape thereon and in which is buried the electronic tag 31 constituted by the mu-chip 2, and the BGAs 28 are accommodated respectively within the pockets 26*a* formed in the carrier tape 26.

Thereafter, the cover film 26*c* is disposed on the pockets 26*a* in corresponding relation thereto and then heat-sealed, whereby the pockets 26*a* are sealed.

It is preferable that the carrier tape 26, reel 25 and cover film 26*c* be each fabricated in a clean environment, for example, in an environment wherein the size of dust particle present therein is not larger than 100 μm.

Subsequently, the tape is wound up. That is, the carrier tape 26 is wound round the reel 25.

Then, tape-reel packing is performed. More specifically, the tape-reel 24 is accommodated into a moistureproof bag 16, followed by heat-sealing. The moistureproof bag 16 is formed of aluminum for example and is preferably fabricated in a clean environment, e.g., in an environment wherein the size of dust particle present therein is not larger than 100 μm, whereby it is possible to realize a clean packing of semiconductor devices.

Moreover, since there is used the tape-reel 24 having the electronic tag 31 of the mu-chip 2 with recognizable information stored therein, it is possible to eliminate paper label from the moistureproof bag 16 and hence possible to prevent the occurrence of a dust particle defect.

Thereafter, inner case packing is performed. More specifically, the tape-reel 24 which has been accommodated into the moistureproof bag 16 in the tape-reel packing work is further accommodated into an inner case 4 and a buffer material 30 is put thereon, followed by packing.

Then, the inner case 4 is inserted into an outer case for shipping.

The semiconductor device accommodating and carrying method according to this second embodiment is different from the first embodiment only in that the tray as the receptacle is substituted by the tape-reel 24. The effect obtained by using the tape-reel 24 is also the same as the effect obtained by using the tray 1. Also as to the semiconductor device mounting method and the receptacle re-utilizing method according to this second embodiment, they are the same as the first embodiment except that the tray 1 as the receptacle is substituted by the tape-reel 24.

Third Embodiment

Figure 34:
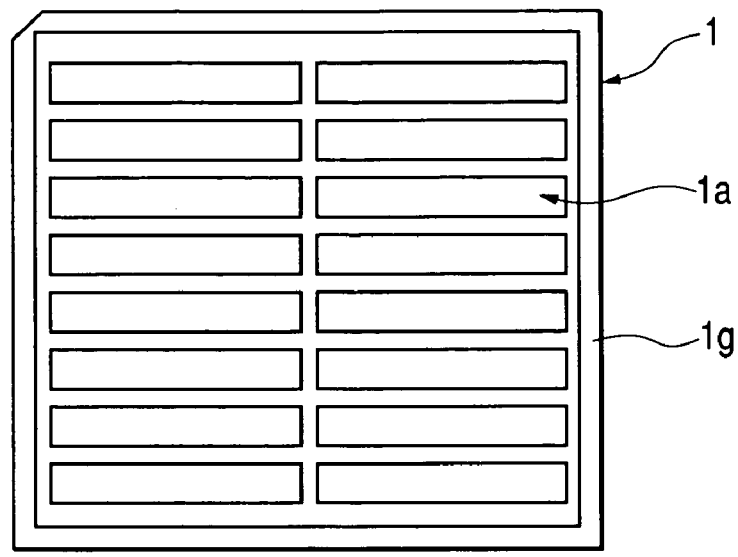
FIG. 34 is a plan view showing a structural example of a tray (receptacle) with bar code which is used in accommodating and carrying a semiconductor device in a third embodiment of the present invention.
Figure 35:
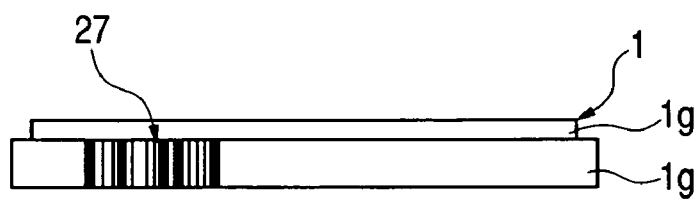
FIG. 35 is a side view showing the structure of the tray illustrated in FIG. 34.
Figure 36:
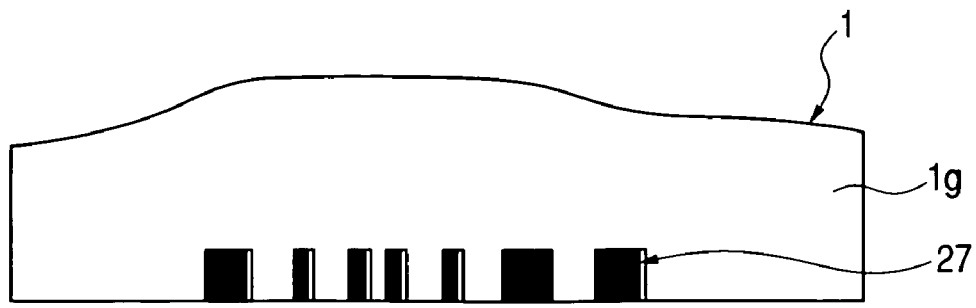
FIG. 36 is an enlarged partial side view showing a detail structure of the bar code illustrated in FIG. 35.

FIG. 34 is a plan view showing a structural example of a tray (receptacle) with bar code used in a semiconductor device accommodating and carrying method according to a third embodiment of the present invention, FIG. 35 is a side view showing the structure of the tray illustrated in FIG. 34, and FIG. 36 is an enlarged partial side view showing a detail structure of the bar code illustrated in FIG. 35.

In this third embodiment, instead of the mu-chip 2 as a non-contact recognition type chip explained in the previous first and second embodiments, there is used a bar code 27 as means having information capable of being read in a non-contact manner.

To be more specific, such a bar code 27 as shown in FIG. 35 is provided in part of an outer periphery surface of a side wall 1g of a tray 1 shown in FIG. 34. The bar codes 27 represents various information pieces, including ID, manufacturer's name and product number of the tray 1, as well as product name, quantity and lot number of an object accommodated on the tray, which information pieces can be read in a non-contact manner.

The bar code 27 may be formed by forming concaves and convexes in the tray itself and applying ink thereto as in FIG. 36 or by printing it on an outer periphery surface of the side wall 1g after formation of the tray 1.

The bar code 27 may be formed not only on the tray 1 but also on the reel 25 of the tape-reel 24 which has been explained as a modification of the receptacle in the second embodiment.

Thus, even if the bar code 27 is used as a substitute for the mu-chip 2, it is possible to obtain the same effect as the effect obtained in the first embodiment.

Although the present invention has been described above concretely on the basis of embodiments thereof, it goes without saying that the present invention is not limited to the above embodiments, but that various changes may be made within the scope not departing from the gist of the invention.

For example, as the memory in the mu-chip 2 described in the first and second embodiments there may be used a rewritable memory, whereby it is possible to not only store number of times the receptacle such as tray 1 or tape-reel 24 is re-used but also rewrite the number of times at every re-use. As a result, when a predetermined number of times of use is reached, it is possible to prevent a further use of the receptacle and thus possible to prevent quality deterioration of the receptacle.

Cleaning of the receptacle such as the tray 1 and or the tape-reel 24 may be done on the IC manufacturers' side.

Although in the second embodiment reference was made to BGA 28 as the semiconductor device, the semiconductor device is not limited to BGA 28, but may be, for example, such a lead type semiconductor package as QFP (Quad Flat Package) or SOP (Small Outline Package).

Further, although in the diagram illustrating a stacked state of trays 1 in the first embodiment the number of stages in the tray stack is three, there is made no limitation thereto, but any other number of stack stages will do.

The following is a brief description of effects obtained by typical modes of the invention as disclosed herein.

By accommodating semiconductor devices in a receptacle such as a tray provided with a non-contact recognition type chip with recognizable information stored therein or a bar code and carrying the receptacle, it is possible to prevent the generation of dust and hence possible to accommodate, carry and mount semiconductor devices in a clean condition.

On the mounting manufacturer side it is possible to check correctly and quickly whether received products are the same or not as ordered products.

Further, by transmitting information of the non-contact recognition type chip or bar code electrically to the receptacle recovery/re-use trader, it is possible for the recovery/re-use trader to sort the recovered receptacles by reading with the reader, not visually, so that the sorting of receptacles can be done easily and correctly.

What is claimed is:

1. A method for carrying a semiconductor device, comprising the steps of:
  (a) providing a plurality of semiconductor devices each having a main surface, a back surface opposite to the main surface, and a plurality of external terminals;
  (b) providing a tray having a front surface, a rear surface opposite to the front surface, an electronic tag imbedded in the tray, a plurality of first concaved portions formed on the front surface, a plurality of second concaved portions formed on the rear surface, the electronic tag constituted by a non-contact recognition type chip having a memory circuit in which recognizable information is stored, a depth of the first concaved portion is deeper than a depth of the second concaved portion;
  (c) housing the plurality of semiconductor devices into the plurality of first concaved portions respectively in such a manner that the back surface of the semiconductor device being oppose to a bottom of the first concaved portion; and
  (d) carrying the tray with the plurality of semiconductor devices.

2. The method according to claim 1, wherein the recognizable information is related to a manufacturer's name and a product number of the tray.

3. The method according to claim 1, wherein the semiconductor device is a semiconductor chip.

4. The method according to claim 3, wherein, in the step (c), the semiconductor chip is accommodated in the tray in an atmosphere wherein the size of dust particle present therein is not larger than 5 μm.

5. The method according to claim 1, wherein the semiconductor device is a semiconductor package with a semiconductor chip incorporated therein.

6. The method according to claim 5, wherein, in the step (c), the semiconductor device is accommodated in the tray in an atmosphere wherein the size of dust particle present therein is not larger than 100 μm.

7. The method according to claim 1, wherein each of the plurality of first concaved portions is shaped quadrangle in a plan view.

8. The method according to claim 7, wherein the plurality of first concaved portions are partitioned with a plurality of ribs, and the ribs are not formed at a corner of the first concaved portion.

* * * * *